United States Patent
Ito

(10) Patent No.: US 7,625,523 B2
(45) Date of Patent: *Dec. 1, 2009

(54) GA-BASE ALLOY AND ORGANIC FUNCTION ELEMENT USING THE SAME

(75) Inventor: Nobuyuki Ito, Shinjuku-Ku (JP)

(73) Assignee: Dai Nippon Printing Co., Ltd., Shinjuku-ku (JP)

( * ) Notice: Subject to any disclaimer, the term of this patent is extended or adjusted under 35 U.S.C. 154(b) by 228 days.

This patent is subject to a terminal disclaimer.

(21) Appl. No.: 11/253,801

(22) Filed: Oct. 19, 2005

(65) Prior Publication Data

US 2006/0083655 A1  Apr. 20, 2006

(30) Foreign Application Priority Data

Oct. 20, 2004  (JP) .............................. 2004-305168
Dec. 24, 2004  (JP) .............................. 2004-373820

(51) Int. Cl.
*C22C 28/00* (2006.01)
(52) U.S. Cl. ...................................... 420/555
(58) Field of Classification Search .................. 420/555
See application file for complete search history.

(56) References Cited

U.S. PATENT DOCUMENTS

| | | | | |
|---|---|---|---|---|
| 4,398,975 A | * | 8/1983 | Ohsawa et al. | 148/400 |
| 5,120,498 A | * | 6/1992 | Cocks | 420/580 |
| 6,320,311 B2 | * | 11/2001 | Nakaya et al. | 313/506 |

FOREIGN PATENT DOCUMENTS

| JP | 04-212287 | 8/1992 |
|---|---|---|
| JP | 05-074503 | 3/1993 |
| JP | 2002-008443 | 1/2002 |

* cited by examiner

*Primary Examiner*—Roy King
*Assistant Examiner*—Jie Yang
(74) *Attorney, Agent, or Firm*—Burr & Brown

(57) ABSTRACT

There are provided a metal material for electrode formation, which can form an electrode provided in an organic function element without adopting vapor deposition, can easily realize an increase in size, can reduce production cost, and does not cause any disconnection of the electrode upon exposure to flexure and, thus, is highly reliable, and, at the same time, has a high level of electron injection function, and an organic function element using the metal material. The metal material is a Ga(gallium)-base alloy which is in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

15 Claims, 6 Drawing Sheets

GA-BASE ALLOY AND ORGANIC FUNCTION ELEMENT USING THE SAME

BACKGROUND OF THE INVENTION

1. Field of the Invention

The present invention relates to a metal material for electrode formation. More particularly, the present invention relates to a metal material for electrode formation, which can form an electrode without adopting vapor deposition, can easily realize an increase in size, can reduce production cost, and does not cause any disconnection of the electrode upon exposure to flexure and, thus, is highly reliable, and, at the same time, has a high level of electron injection function, and an organic function element using the metal material.

2. Background Art

In organic function elements, for example, organic semiconductor elements, organic thin-film transistor elements (hereinafter referred to as "organic TFT elements") and organic electroluminescent elements (hereinafter referred to as "organic EL elements"), more charges, particularly electrons, should be injected into an organic material layer.

Substances with a low work function have a good electron injection effect, and, thus, alkali metals and alkaline earth metals are suitably used as an electron injection layer. An electron injection layer of organic EL elements and the like has hitherto been formed by stacking an alkali metal or an alkaline earth metal and a metal(s) other than these metals on top of each other usually, for example, by vapor deposition (for example, see Japanese Patent Laid-Open Nos. 320763/1997, 12381/1998, and 329746/1999).

According to the techniques disclosed in the above patent documents, an electrode is formed by vapor deposition. For example, a plurality of types of metals are provided as independent vapor deposition sources, and an electrode region formed of an alloy containing an alkali metal or an alkaline earth metal is formed by codeposition near a luminescent layer in the element. According to another conventional technique, an alloy of an alkali metal or an alkaline earth metal with other metal is provided, and an electrode is formed by vapor deposition or sputtering using this alloy as a target material.

Alkali metals and alkaline earth metals, however, are highly oxidizable and highly combustible in the air and thus are unstable. Due to these properties, the alkali metals and alkaline earth metals are difficult to handle. For this reason, in forming an electron injection layer in the electrode, film formation should be carried out in vacuo by vapor deposition or the like. The above problem is found not only in organic EL elements but also in general organic function elements comprising an organic material layer and an electrode.

Regarding the method for EL layer formation, in general, when a low-molecular material is used as the material for an EL layer, vacuum deposition using a mask is used, while, when a polymeric material is used, methods in which a material is brought to a solution which is then coated, for example, ink jetting, spin coating, printing, and transfer methods are used. In recent years, there is a report about coatable low-molecular materials.

In mask vacuum deposition for low-molecular materials, an increase in size of a vacuum device and a deposition mask is difficult. This disadvantageously poses a problem that increasing the size of the substrate is difficult, and the mass production of large elements is difficult. This means that, although, on a scale of an experimental level in a development stage, the vacuum deposition method can be applied even in the case of a large substrate, in a full-scale mass production stage, market competitiveness is low for tact and cost reasons.

On the other hand, for polymeric materials and coatable low-molecular materials, film formation can be carried out by wet processes such as ink jetting, printing, casting, alternate absorption, spin coating, and dipping methods, and, thus, there is no problem with coping with large substrates. This renders the coating process favorable as a method for organic EL element formation. For example, as disclosed in Japanese Patent No. 3239991, an EL layer can easily be formed by dissolving PPV (polyphenylene vinylene) as a polymeric organic EL material in an organic solvent to prepare a coating liquid which is then spin coated onto a transparent electrode.

Regarding a negative electrode, since a low-work function metal such as Al (aluminum) or Ag (silver) is used, the electrode is formed as a film by vacuum deposition of these metals.

When the vacuum deposition method is applied to the formation of the negative electrode, however, in forming an EL layer by coating, a vacuum device should be provided only for the negative electrode formation. Further, when the step of vacuum deposition is included in the production process, production tact is sometimes delayed due to vacuuming. Therefore, the feature of organic EL materials which can be coated for film formation cannot be fully utilized. Accordingly, the development of metal materials for negative electrode which can be formed by coating has been desired.

Flexibility may be mentioned as other feature of an organic EL film formed by coating. When an element is formed using a flexible base material such as a resin or a plastic, the so-called "flexible element" can be produced. However, a negative electrode has been an obstacle to the formation of the flexible element. Specifically, even when the substrate and the organic material layer are flexible, the electrode of a metallic thin film which has been formed by vapor deposition as in the prior art is not flexible and, upon flexing, is disconnected.

Regarding the utilization of Ga (gallium) and a Ga alloy, which is a liquid metal, as an electrode in the broad sense, Japanese Patent Laid-Open No. 74503/1993 discloses that Ga and a Ga alloy are used in electrical connecting means. According to this technique, attention has been drawn to easy bonding and easy separation of the liquid metal, and the liquid metal is utilized, for example, in contact points of connector pins and the like. This publication, however, does not disclose the utilization of the liquid metal as an electrode for energization of an organic material layer or the action of an electric field on the organic material layer for developing the function of organic function elements.

Japanese Patent Laid-Open No. 8443/2002 discloses a heat curable metal paste prepared by mixing a Ga-base liquid metal and Ag (silver) or Cu (copper) metal powder together. This curing action utilizes a diffusional reaction, and the diffusion region in which an alloying reaction takes place is on the order of several microns. Therefore, the coating thickness of the paste should be not more than 10 μm (see Japanese Patent Laid-Open No. 326411/1994, paragraph No. 0024).

On the other hand, all of screen printing, metal mask printing, and dispenser coating are a simple and cost competitive film formation method. These coating methods, however, are not suitable for thin film formation.

Further, in forming a film by printing a metal paste, there is a fear of causing metal powder to damage the organic EL layer. In the above patent document, an Ag powder having a particle diameter of 2 μm is used. Since, however, the organic EL layer is generally an ultrathin film having a thickness of not more then 100 nm, the separation of the organic EL layer is unavoidable. The separation of the organic EL layer is causative of a fatal trouble of electrical contact between opposed electrodes. Further, as a matter of course, heat curing of the metal paste poses a problem of disconnection.

In recent years, flat displays have become used in various fields and places, and advance in information technology has rendered flat displays more and more important. At the present time, liquid crystal displays (also known as "LCDs") are representative flat displays. The development of organic ELs, inorganic ELs, plasma display panels (also known as "PDPs"), light emitting diode displays (also known as "LEDs"), vacuum fluorescent displays (also known as "VFDs"), field emission displays (also known as "FEDs") and the like as flat displays based on a display principle different from that of LCDs are also being energetically made.

Among them, organic ELs are particularly energetically studied. Organic EL is also known as OEL or an organic light emitting diode (OLED).

OEL elements and OLED elements have a structure comprising an organic compound-containing layer (EL layer) held between a pair of anode and cathode electrodes. According to Japanese Patent No. 1526026, Tang et al., the structure is basically a laminated structure of "positive electrode/hole injection layer/luminescent layer/negative electrode." Further, Tang et al. uses a low-molecular material, whereas Henry et al. (Japanese Patent No. 3239991) uses a polymeric material.

Further, a hole injection layer and an electron injection layer have been used for luminescent efficiency improvement, and a fluorescent colorant or the like has been doped into a luminescent layer for controlling a luminescent color. Furthermore, in organic ELs, since high-luminance luminescence is obtained by driving at a relatively low voltage of not more than 10 V, the application of organic ELs as lighting equipment which is an alternative to fluorescent lamps involving a problem derived from the use of mercury is also expected. Further, the conventional organic EL element uses only fluorescent luminescence which takes place in return of a singlet excited state to a ground state. In recent years, phosphorescence which takes place in return of a triplet excited state to the ground state could have become effectively utilized. This had led to improved luminescent efficiency.

Here the conventional organic EL element will be simply described. FIG. 7 is a typical diagram showing a basic sectional structure of the conventional organic EL element 101. An organic EL element 101 has a basic structure comprising an organic material layer including at least a luminescent layer (EL layer) 104 held between an anode 103 and a cathode 105. An electric field is applied across both the electrodes to allow current to flow into the EL layer and thus to emit light. If necessary, the luminescent layer 104 may have a multilayered structure which has auxiliary layers such as a hole injection layer 106 or an electron injection layer 107.

The organic EL element 101 is generally produced by providing a light transparent substrate 102 such as a glass substrate or a plastic substrate, and, due to the relationship between the energy level of the EL layer and the work function of the transparent electrode such as ITO, forming, on the substrate 102, a transparent electrodes as a positive electrode 103 and then an EL layer as a luminescent layer 104 and a negative electrode 105 as a counter electrode in that order. In the organic EL element 101 having the above structure, luminescence 108 can be observed from the transparent electrode (positive electrode 103) side.

Organic functional materials including organic ELs have low resistance to oxygen and water, and, thus, element characteristics are significantly deteriorated in an air exposed state as shown in FIG. 7. Accordingly, it is common practice to adopt an element structure as shown in FIG. 8 in which a sealing body 109 is provided for shielding the assembly from the air. In FIG. 8, the sealing body 109 is fixed into the element substrate with the aid of an adhesive 110 to shield the element from the ambient air, and, further, a desiccant 111 is provided within the sealing body for deterioration preventive purposes. The opposed electrodes 103,105 are connected respectively to terminal electrodes 103,103' so that drive signals can be applied through the terminal electrodes from the outside of the sealing body.

The transparent electrode can be provided separately from subsequent EL layer formation by sputtering or vacuum-depositing a transparent electrically conductive film such as ITO or IZO onto a transparent substrate.

As described above, the self-luminous flat display element has excellent features, but on the other hand, it suffers from problems such as difficulties of increasing the size of the substrate, difficulties of mass-producing large elements, and disconnection of electrodes upon flexing.

SUMMARY OF THE INVENTION

In view of the above problems of the prior art, the present invention has been made, and an object of the present invention is to provide a metal material for electrode formation, which can form electrodes in organic function elements, such as organic semiconductor elements or organic EL elements typified by organic TFT elements, without adopting vapor deposition, can easily realize an increase in size, can reduce production cost, and does not cause any disconnection of the electrode upon exposure to flexure and, thus, is highly reliable, and, at the same time, has a high level of electron injection function, and an organic function element using the metal material.

According to one aspect of the present invention, there is provided a Ga-base alloy which is a Ga(gallium)-base alloy which is in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

According to another aspect of the present invention, there is provided a process for producing a Ga-base alloy, the process comprising dissolving an alloy of an alkali metal or an alkaline earth metal with In (indium) or Sn (tin) in a Ga(gallium)-base liquid metal in a liquid state at room temperature to prepare a Ga-base alloy paste.

According to still another aspect of the present invention, there is provided an organic function element comprising at least a plurality of electrodes and an organic material layer, at least one of the plurality of electrodes comprising the above Ga-base alloy.

According to a further aspect of the present invention, there is provided a process for producing an organic function element, the process comprising the steps of:

heating a Ga-base alloy to bring the Ga-base alloy to a paste state; and forming a film from the Ga-base alloy paste by screen printing, metal mask printing, or dispenser coating to form at least one electrode, the Ga-base alloy being in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

According to the Ga-base alloy according to the present invention, organic function elements, particularly organic EL elements and organic TFT elements can be prepared by forming an electrode on an organic material layer without the use of any vacuum film formation method such as vapor deposition.

Further, since the electrode of an organic function element is formed using a metal in a paste state, an electrode in any desired form can be formed by a coating method or other wet process such as printing under room temperature or mildly heated conditions without relying upon any vapor phase process such as vapor deposition. Accordingly, the production cost is low and, at the same time, the size of the electrode is not limited by the size of the deposition apparatus. Thus, the size of the organic function element can be increased, and, further, a reduction in production cost can be realized.

The electrode formed by using a metal paste, even when the substrate is flexed, can conform to the flexure and can be deformed flexibly to some extent. Therefore, a highly reliable organic function element which is less likely to cause electrode disconnection and is also suitable as a flexible element can be provided.

Further, in adding an alkali metal or an alkaline earth metal to the electrode, since a Ga-base alloy in a paste state prepared by mixing an alkali metal or an alkaline earth metal to a Ga-base liquid metal is used, the electrode can be formed by a wet process. Therefore, it is very easy to handle the alkali metal or alkaline earth metal.

Furthermore, in the organic function element according to the present invention, the electrode can be formed in a predetermined shape by using a screen plate, a metal mask, or a dispenser. Therefore, the shape can be regulated more easily than that formed, for example, by a method in which a mask is used in a vapor phase process such as vapor deposition or a method in which etching is carried out after deposition.

Furthermore, in the organic function element according to the present invention, since the element can be prepared in vacuo or in an inert gas, the homogeneity of luminescence in the luminescent face can be further improved. In addition, since the shape of the electrode can also be desirably regulated as described above, the percentage completion as the luminescent element can be improved.

DETAILED DESCRIPTION OF THE INVENTION

Ga-Base Alloy

Figure 1:
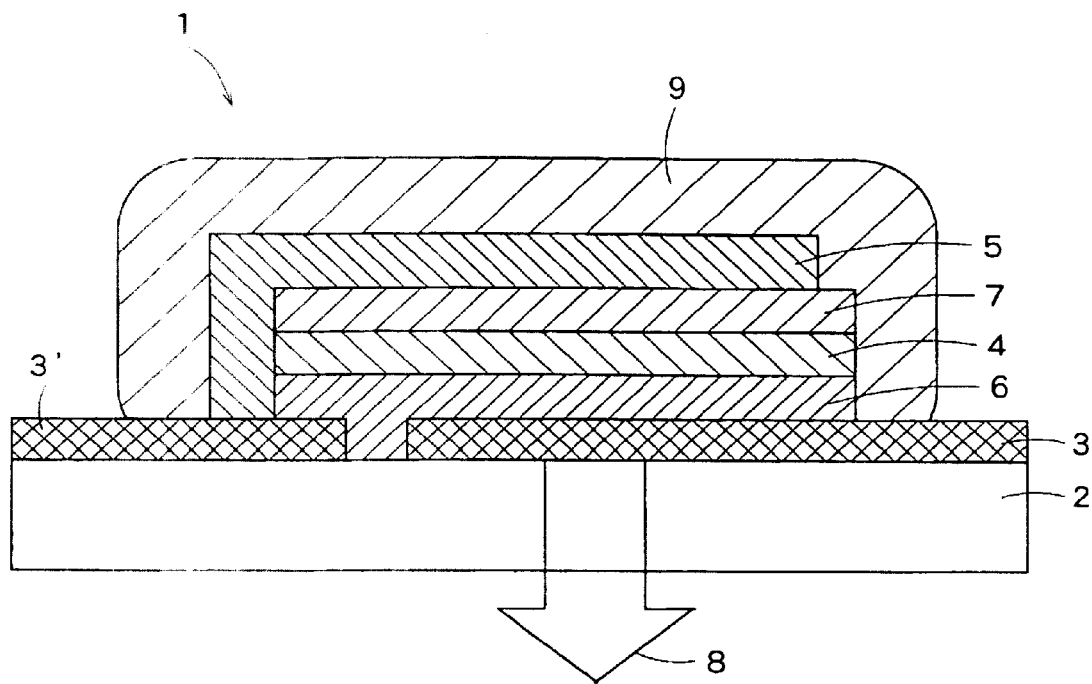
FIG. 1 is a typical view showing a sectional structure of an embodiment of the organic EL element according to the present invention.

The Ga-base alloy according to the present invention is a Ga(gallium)-base alloy in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

In general, the term "metal paste" as used herein refers to a paste which has been generally prepared by dispersing metal powder in a resin as a binder for pasting (gelatinization). The "paste state" as used herein refers to such a state that the paste does not contain any resin and is constituted by the metal only. Since the electrode formed of the metal paste does not contain a resin and the like, an excellent electron injection function can be realized. The term "electron injection function" as used herein refers to a function that, upon electric field application, can realize injection of holes from the anode or hole injection layer and injection of electrons from the cathode or electron injection layer.

The Ga-base liquid metal is liquid at room temperature (approximately 5 to 45° C.) and is satisfactorily fluid at room temperature or a relatively low temperature up to a metal temperature of about 50° C. when the metal is heated. The melting point is preferably 50° C. or below. Ga or an alloy of Ga with one or at least two metals selected from In (indium), Sn (tin), and Zn (zinc) is suitable in the Ga-base liquid metal.

The Ga-base alloy is preferably used because the fluidity and toxicity at room temperature are on a low level. In the present invention, the term "alloy" refers to a metal which is composed of two or more metals and is apparently homogeneous and does not necessarily require the formation of a metal bond between dissimilar metals. Further, in the present invention, the Ga-base alloy is mainly composed of Ga, and, preferably, 40% by mass, more preferably 50% by mass, of the metals constituting the Ga-base alloy is accounted for by Ga.

Ga as a simple substance has a melting point of 30° C. and a boiling point of 2400° C., that is, is liquid over a wide temperature range from room temperature to an elevated temperature. Metals capable of maintaining the liquid state at a lower temperature usable herein include Ga-base liquid metals comprising Ga and, further, at least one other metal of In, Sn, and Zn as indispensable components. Table 1 shows the composition ratio and melting point of Ga and an example of Ga-base liquid metals usable in the present invention.

TABLE 1

| No. | Ga-based liquid metal | Composition, wt % | Melting point, ° C. |
|---|---|---|---|
| 1 | Ga | 100 | 30 |
| 2 | Ga—In | 75.5:24.5 | 16 |
| 3 | Ga—In—Sn | 62.0:25.0:13.0 | 5 |
| 4 | Ga—In—Zn | 67.0:29.0:4.0 | 13 |
| 5 | Ga—Sn | 92.0:8.0 | 20 |
| 6 | Ga—Zn | 95.0:5.0 | 25 |

The composition of the components constituting the Ga-base alloy according to the present invention refers to the charged mass of the previously weighed metal components, or alternatively a composition as measured by X-ray diffraction, XPS, or other proper method.

The alkali metal or alkaline earth metal constituting the Ga-base alloy according to the present invention is preferably at least one metal selected from Ca (calcium), Li (lithium), Na (sodium), K (potassium), Mg (magnesium), Rb (rubidium), Cs (cesium), Ba (barium), Be (beryllium), and Sr (strontium).

Alkali metals or alkaline earth metals are roughly classified according to the melting point into low-melting metals, i.e., Li (lithium) (180° C.), Na (sodium) (98° C.), K (potassium) (64° C.), Rb (rubidium) (39° C.), and Cs (cesium) (29° C.), and high-melting metals, i.e., Ca (calcium) (839° C.), Mg (magnesium) (650° C.), Ba (barium) (725° C.), Be (beryllium) (1284° C.), and Sr (strontium) (770° C.). Since the alkali metal or alkaline earth metal is highly oxidatively combustible in the air and thus is dangerous, preferably, the alkali metal or alkaline earth metal is generally handled within a glove box in which the air has been replaced by inert gas.

The above metals belonging to the group of low-melting metals can be relatively safely heat melted in a glove box and thus can be weighed and mixed into the Ga-base liquid metal. On the other hand, for the metals belonging to the group of high-melting metals, heat melting for mixing directly into the Ga-base liquid metal even within a glove box is very dangerous because of the large quantity of heat. For this reason, a method is preferably adopted in which an alloy of the high-melting metal with other metal is previously prepared within a vacuum melting furnace which can prevent combustion, followed by handling in a stable state.

Both alkali metals or alkaline earth metals are preferred because they have a low level of work function and can develop a high level of electron injection function, and Ca (work function 2.87 eV), Li (work function 2.4 eV), Na (work function 2.36 eV), K (work function 2.28 eV), Mg (work function 3.66 eV), Rb (work function 2.16 eV), Cs (work function 2.14 eV), Ba (work function 2.52 eV), Be (work function 2.45 eV), and Sr (work function 2.59 eV) are suitable. In the present invention, the values of the "work function" in each element are based on data described in "J. Appl. Phys. vol. 48" (1977), p. 4729, and measured data obtained with an ionization potential measuring device.

Among them, Ca is particularly preferred because it can easily be mixed in a large amount into the Ga-base liquid metal. It is considered that Ca has much larger molar volume than other metals and can be melted in a large amount in the Ga-base liquid metal. Further, a negative electrode which has high power conversion efficiency and long element service life can easily be provided. One example of the molar volume of each metal will be summarized below.

Ca: $26.2 \times 10^3$ ($m^3$/mol)
Li: $13.0 \times 10^{-6}$ ($m^3$/mol)
Na: $23.8 \times 10^{-3}$ ($m^3$/mol)
K: $45.9 \times 10^{-3}$ ($m^3$/mol)
Mg: $14.0 \times 10^{-3}$ ($m^3$/mol)
Rb: $55.8 \times 10^{-6}$ ($m^3$/mol)
Cs: $70.9 \times 10^{-3}$ ($m^3$/mol)
Ba: $38.2 \times 10^{-3}$ ($m^3$/mol)
Be: $4.9 \times 10^{-3}$ ($m^3$/mol)
Sr: $33.9 \times 10^{-3}$ ($m^3$/mol)

When 5 to 30% by mass of Ca is contained, as will be described later, a suitable level of pasting properties can be realized, and, at the same time, an electron injection function can be developed. Further, mixing of a minor amount of other alkali metal or alkaline earth metal can impart a further high level of electron injection function.

In or Sn is preferred as other metals which can form an alloy with alkali metals or alkaline earth metals. An alloy of an alkali metal or alkaline earth metal with In or Sn can be melted in a Ga-base liquid metal at room temperature in the air and thus can easily be weighed and mixed in the Ga-base liquid metal. Further, since In or Sn can easily be melted in Ga, even when the alloy is dissolved in the Ga-base liquid metal, there is no fear of causing In or Sn to be separated as a solid phase, and, thus, a Ga-base alloy in a homogeneous paste state can be produced.

Even alkali metals or alkaline earth metals belonging to the group of high-melting metals can of course be alloyed directly with the G-base liquid metal in a vacuum melting furnace. However, a method, in which an alloy of an alkali metal or alkaline earth metal with In or Sn is previously prepared and this alloy is mixed into the Ga-base liquid metal, is preferred from the viewpoint of varying conditions such as concentration regulation.

The Ga-base alloy prepared by this method can be brought to a liquid state (the melting point being lowered) at a lower temperature than Ga as a simple substance and thus is easy to handle.

In order to bring the Ga-base liquid metal to a highly viscous paste, the incorporation of 5 to 30% by mass of Ca is particularly preferred. When the Ca concentration falls within this range, the viscosity can be brought to 5 to 100 Pa·s which is suitable in various printing methods. Further, in this case, a satisfactory electron injection function necessary for organic EL elements can be developed as an electrode. The viscosity somewhat varies depending upon the type of the Ga-base liquid alloy in addition to the Ca concentration.

The metal paste is effective as an electron forming material. Further, the utilization of the metal paste as an electrode constituting an organic function element is particularly preferred. The electrode in a paste form, even when the substrate is flexed, can conform to the flexure and can be deformed flexibly to some extent and thus is advantageous with respect to disconnection, but on the other hand, since the electrode is not in a cured state, it should be firmly fixed by any method. In one embodiment of the organic function element according to the present invention, an element structure as shown in FIG. 1 is preferred in which an electrode formed of a Ga-base alloy in a paste state is fixed and sealed with the aid of an adhesive layer 9. The material for the adhesive layer is preferably a resin adhesive such as a two-component reaction curable or UV curable resin adhesive from the viewpoint of easy handling.

Preferably, the Ga-base alloy according to the present invention further comprises a metal having a melting point of 300° C. or below and which is in a solid state at room temperature and is brought to a paste state at a temperature of the melting point of the Ga-base alloy or above. When the Ga-base alloy further contains a metal having a melting point of 300° C. or below, a Ga-base alloy, which is in a solid state at room temperature and is brought to a paste state at a temperature of the melting point or above, is obtained. The use of the above Ga-base alloy in the electrode formation can eliminate the need to form the adhesive layer.

The Ga-base alloy in the above preferred embodiment is in a solid state at room temperature. Upon heating, the alloy begins to soften at a certain temperature. When the alloy is further heated, the alloy is passed through a viscous paste state and is then brought to a liquid state. The term "melting point" as used herein refers to a temperature at which a metal begins to soften (softening temperature) rather than the temperature at which the metal transits to the liquid state.

In adding a metal having a melting point of 300° C. or below, a method is adopted which comprises dissolving an alloy of an alkali metal or an alkaline earth metal with In or Sn in a Ga-base liquid metal which is liquid at room temperature to form a paste of a Ga-base alloy, heating the alloy paste to a temperature at which the metal having a melting point of 300° C. or below is melted, and mixing the metal having a melting point of 300° C. or below into the alloy paste.

Metals having a melting point of 300° C. or below include In, Sn, Bi, or an alloy composed mainly of them. Among them, InSn is suitable. In this case, the term "alloy" refers to a metal which is composed of two or more metals and is apparently homogeneous and does not necessarily require the formation of a metal bond between dissimilar metals.

An example of metals having a melting point of 300° C. or below usable in the Ga-base alloy according to the present invention will be summarized in Table 2.

TABLE 2

| No. | Metal with melting point of 300° C. or below | Composition, wt % | Melting point, ° C. |
|---|---|---|---|
| 1 | In | 100 | 160 |
| 2 | In—Sn | 52.0:48.0 | 117 |
| 3 | Sn | 100 | 230 |
| 4 | Sn—Bi | 57.0:43.0 | 139 |
| 5 | Sn—Ag | 96.5:3.5 | 221 |
| 6 | Bi | 100 | 270 |
| 7 | Bi—Pb—Sn | 50.0:28.0:22.0 | 100 |
| 8 | Bi—Pb—Sn—Cd | 40.0:40.0:11.5:8.5 | 130 |
| 9 | Bi—Pb—Sn—Sb | 47.7:33.2:18.8:0.3 | 130 |
| 10 | Bi—Cd | 60.0:40.0 | 144 |
| 11 | Bi—Cd—In | 60.0:35.5:5.0 | 137 |
| 12 | Bi—Sn—Ag | 57.0:42.0:0.5 | 194 |

The Ga-base alloy according to the present invention is brought to a fully liquid state at a high temperature above the melting point. Accordingly, the "paste state" is considered in a viscous region intermediate between the liquid state and the solid state. In the present invention, the temperature range in which the alloy is in a paste state is preferably 5° C. or above. When the temperature is on this level, the organic function element can be stably produced.

Further, preferably, the Ga-base alloy according to the present invention has a melting point of 50° C. or above. When the melting point is below 50° C., in some cases, the electrode of the produced organic function element is melted and separated, for example, upon a change in environment. In order that the Ga-base alloy is in a solid state at room temperature and is brought to a paste state at the temperature of the melting point or above, the content of Ca in the Ga-base alloy is preferably 5 to 30% by mass from the viewpoints of providing the above temperature properties. The viscosity of the paste also varies depending upon the Ca content, as well as upon the type of the metal having a melting point of 300° C. or below.

The Ga-base alloy according to the present invention is produced by melt-mixing a Ga-base liquid metal as indicated in Table 1, a metal having a melting point of 300° C. or below as indicated in Table 2, and an alkali metal or alkaline earth metal such as Ca together. When Ca is used, melting mixing is preferably carried out within a vacuum melting furnace or in an inert gas melting furnace in order to prevent combustion and explosion of Ca.

Specifically, from the viewpoints of safety and handleability, a method is preferably adopted in which an alloy of In or Sn, i.e., a metal which can be easily melted in the Ga metal, with Ca is previously prepared in a vacuum melting furnace and the resultant CaIn or CaSn alloy is melted in the Ga-base liquid metal.

When the CaIn or CaSn alloy is immersed in the Ga-base liquid metal, the alloy can be dissolved in the Ga-base liquid metal at room temperature to prepare a Ga-base alloy in a paste state. This Ga-base alloy has a good electron injection function and, thus, for example, upon coating onto an organic EL layer, exhibits good luminescence characteristics. Specifically, for an organic EL element or other organic function elements, in order to regulate larger current, preferably, the electrode has good charge injection efficiency (hole injection efficiency for a positive electrode and electron injection efficiency for a negative electrode). For this reason, a metal having a low work function is used in the negative electrode from the viewpoint of easy release of electrons. In the conventional negative electrode, Al (aluminum) having a work function of 4.2 eV is favorably used as a representative metal. In the Ga-base alloy according to the present invention, the work function of Ga is 4.3 eV, that is, is close to that of Al. Therefore, the Ga-base alloy according to the present invention has advantages as a metal paste and is further advantageous in that, when the Ga-base alloy is used as a negative electrode, electron injection from the negative electrode into the EL layer can be improved.

Further, for example, In, Sn, Bi, and Ga which are metals constituting the Ga-base alloy according to the present invention have work functions of 4.1 eV, 4.4 eV, 4.3 eV, and 4.3 eV, respectively, that is, are close to the work function of Al. Accordingly, the Ga-base alloy according to the present invention is advantageous in terms of the production of electrode formation, as well as in terms of electron injection function.

The Ga-base alloy according to the present invention may optionally contain other metal(s). For example, in order to improve the electron injection efficiency of the negative electrode, at least one metal which is other than Ca and is selected from alkali metals and alkaline earth metals can be mixed as a low-work function material into the negative electrode. Among them, one or more metals selected from Li, Na, K, Mg, Rb, Cs, Ba, Be and Sr are preferred. The addition amount thereof is preferably not more than 1% by mass, more preferably 0.05 to 2% by mass. When the addition amount falls within the above-defined amount range, these metals do not affect the paste properties of the Ga-base alloy. The method for adding these metals is as described above.

Organic Function Element

The organic function element comprises at least a plurality of electrodes and an organic material layer, at least one of the plurality of electrodes comprising the above Ga-base alloy paste. In the present invention, the organic function element is an element that, upon energization of the organic material layer or the application of an electric field to the organic material layer, the organic material layer exhibits predetermined functions such as luminescence or switching. Examples of such organic function elements include organic EL elements and, further, organic TFT elements or other organic semiconductor elements. The organic material layer has a single-layer or a multilayer structure having at least one layer containing an organic material and exhibits predetermined functions upon energization or the application of an electric field.

The organic function element according to the present invention will be described by taking an organic EL element as an example.

FIG. 1 is a typical cross-sectional view showing an example of the laminated structure of an organic EL element 1 according to the present invention. This organic EL element 1 has a structure comprising: a transparent substrate as a first base material 2; and a transparent electrode as a positive electrode 3, a hole injection layer 6, a luminescent layer (EL layer) 4, an electron injection layer 7, a negative electrode 5, and a cathode protective sealing layer 9 stacked in that order on one side of the first base material 2. Luminescence 8 from the luminescent layer 4 can be viewed through the transparent positive electrode 3 and the first base material 2.

In this embodiment, two electrodes of a positive electrode 3 and a negative electrode 5 are provided. The negative electrode 5 is coated onto the electron injection layer 7 and is covered with the adhesive layer 9 which functions both as a protective layer for the negative electrode in a paste state and as a sealing layer.

Further, in this embodiment, an organic material layer having a three-layer structure of the hole injection layer 6, the luminescent layer 4, and the electron injection layer 7 is provided. For an organic EL element, the organic material layer may have a multi-layer structure, that is, may comprise the luminescent layer 4 and optionally one or more auxiliary layers such as the hole injection layer 6 and the electron injection layer 7, and the addition of these auxiliary layers has the effect of improving luminescent functions such as enhanced efficiency and prolonged service life.

In the specification of the present application, unless otherwise specified, a hole injection layer per se, a hole transport layer per se, a combination of a hole injection layer with a hole transport layer, and a layer having both a hole injection function and a hole transport function are collectively referred to as "hole injection layer," and an electron injection layer per se, an electron transport layer per se, a combination of an electron injection layer with an electron transport layer, and a layer having both an electron injection function and an electron transport function are collectively referred to as "electron injection layer."

The method for the formation of an electrode constituting the organic function element according to the present invention will be described. The electrode is formed by coating the Ga-base alloy by any of a screen printing method shown in FIG. 2, a metal mask printing method shown in FIG. 3 or a dispenser coating method shown in FIG. 4 to form a film.

The screen printing method is a method in which a paste 5' is transferred using a screen plate 11 having a pattern formed by a number of fine holes onto an object. This method is suitable for coating of any desired pattern ranging from a simple pattern to a thin line pattern having a width of not more than 100 μm with good accuracy. In the metal mask printing method, the shape of a die-cut metal mask 13 as such is utilized, and this method is suitable for coating of a simple pattern at low cost. The dispenser coating method does not require the preparation of any screen or mask and is also advantageous in that what is required for a change in pattern is only to modify the program, but on the other hand, this method is unsuitable for mass production.

Suitable paste viscosity varies depending upon the production processes. Further, also in each film formation method, the viscosity depends upon the pattern shape. Accordingly, the viscosity of the paste can be regulated to an optical value in the range of 5 to 100 Pa·s by regulating the concentration of Ca in the Ga-base alloy to a value in the range of 5 to 30% by mass and, in addition, selecting the type of the compound added to the Ga-base liquid metal.

In the present invention, preferably, the step of film formation is carried out in an inert atmosphere or in vacuo. This can solve the above problem of deterioration in organic function materials.

The inert gas is preferably nitrogen, argon, or a mixed gas composed of nitrogen and argon.

The above organic function element and production process thereof according to the present invention can be applied to organic EL elements, organic TFT elements, and organic semiconductor elements. Each constituent part of the organic function element will be described.

(1) Electrode Formed of Metal Paste (Negative Electrode)

In the present invention, at least one of the electrodes included in the organic function element is formed of the above Ga-base alloy. For example, in the organic EL element 1 in FIG. 1, the negative electrode 5 is formed of the Ga-base alloy. In the present invention, not only the negative electrode but also the positive electrode may be formed of the Ga-base alloy.

This metal paste can be brought to a film by a wet process at room temperature or under weak heating and can be formed into an electrode having any desired shape by a coating method such as printing or other wet process without relying on a vapor phase process such as vapor deposition. Accordingly, the production cost is lower than that of the vapor phase process. Further, in the production process, the size of the electrode is not limited to the size of vapor deposition apparatus, and, thus, a large-size function element and a production cost reduction can be realized.

The electrode formed of a Ga-base alloy, even when the substrate is flexed, can conform to the flexure and can be deformed flexibly to some extent and thus is advantageous with respect to disconnection, but on the other hand, since the electrode is not in a cured state, it should be firmly fixed by any method. In the present invention, an element structure as shown in FIG. 1 is adopted in which an electrode formed of a Ga-base alloy in a paste state is fixed and sealed with the aid of an adhesive layer 9. The material for the adhesive layer is preferably a resin adhesive such as a two-component reaction curable or UV curable resin adhesive from the viewpoint of easy handling. Thus, a highly reliable organic function element, which is less likely to cause electrode disconnection, can be provided. When a flexible base material formed of a flexible material such as plastic is used, the product is suitable for use as a flexible element.

The alkali metal or alkaline earth metal is highly oxidizable and highly combustible and, thus, is unstable and difficult to handle. For this reason, the alkali metal or alkaline earth metal has hitherto been used only a film formation process in vacuo. By contrast, in the present invention, an electrode can be formed by a wet process using a mixture of a metal paste with an alkali metal or an alkaline earth metal, and, thus, handleability is very good.

In the present invention, the electrode formed of the Ga-base alloy in a paste state is an electrode disposed within or on the surface of the organic function element in order to energize the organic material layer in the organic function element or to apply an electric field but not an electrode for electrically connecting the element to the external.

The electrode formed of the Ga-base alloy according to the present invention may have any of various shapes depending upon the element. Examples of shapes include a shape having two-dimensional broadening such as a thin layer or a stripe, or a spot shape in the case of TFT elements or the like. The size and thickness may also vary depending upon the element. However, the thickness is generally about 0.1 to 100 μm.

(2) Layer or Part Other than Electrode Formed of Metal Paste

In the present invention, the layer or part other than the electrode formed of the Ga-base alloy may be a conventional one depending upon the construction of the organic function element and is not particularly limited. An example of a material usable in the organic EL element 1 shown in FIG. 1 will be described.

<Base Material>

The base material is optionally used for sealing a support in the organic function element or the organic EL element.

When the productivity and cost of the base material are taken into consideration, preferably, the base material in the organic EL element is a base material formed of any one material selected from glass, resins, metals, and ceramics, or a base material formed of a composite material prepared by mixing or stacking two or more materials.

When the substrate side is used as a light takeout face, a transparent base material is used as the base material. The transparent base material may comprise a material which can provide high transparency (approximately not less than 80%) to light emitted from the luminescent layer (EL light). Specific examples thereof include plates, sheets, or films formed of transparent glasses such as alkali glass and alkali-free glass, transparent resins such as polyethylene terephthalate, polycarbonate, polyethersulfone, polyetherether ketone, polyvinyl fluoride, polyacrylate, polypropylene, polyethylene, amorphous polyolefin, and fluororesins, or quartz. The transparent base material which is actually used may be properly selected, for example, according to the application of the contemplated organic EL element.

On the other hand, when the base material is not used as a light takeout face, materials other than the above transparent base materials may also be used as the base material.

<Organic Material Layer>

In the organic EL element as an example of the organic function element according to the present invention, the construction of the organic material layer is not particularly limited. In the organic EL element, various layer constructions may be adopted. Specific examples of the layer construction of the organic EL element of such a type that the layer construction is provided on a transparent substrate, and the transparent substrate side is used as a light takeout face include those in which the order of stacking of each layer provided on the transparent substrate is the following (i) to (iv). When the substrate is not used as the light takeout face, the order of stacking of each layer on the substrate may be the opposite of the following (i) to (iv).

(i) Anode/luminescent layer/cathode
(ii) Anode/hole injection layer/luminescent layer/cathode
(iii) Anode/luminescent layer/electron injection layer/cathode
(iv) Anode/hole injection layer/luminescent layer/electron injection layer/cathode In the organic EL element of the type (i) and the organic EL element in which the order of stacking of each layer is the opposite of the type (i), the luminescent layer corresponds to an organic material layer having a single-layer structure. In the organic EL element of the type (ii) and the organic EL element in which the order of stacking of each layer is the opposite of the type (ii), the hole injection layer and the luminescent layer correspond to an organic material layer having a multi-layer structure. In the organic EL element of the type (iii) and the organic EL element in which the order of stacking of each layer is the opposite of the type (iii), the luminescent layer and the electron injection layer correspond to an organic material layer having a multi-layer structure. Further, in the organic EL element of the type (iv) and the organic EL element in which the order of stacking of each layer is the opposite of the type (iv), the hole injection layer, the luminescent layer, and the electron injection layer correspond to an organic material layer having a multi-layer structure.

In the present invention, not only the electrode but also the organic material layer is preferably formed by the wet process from the viewpoint of further improving the effect of increasing the size of the element and reducing the production cost. The organic material layer may be formed by the wet process in such a manner that a solution prepared by dissolving organic materials such as a luminescent layer material, a hole injection layer material, and an electron injection layer material in a solvent, if necessary, with the aid of a binder and a dispersant is coated by a conventional coating method such as spin coating onto a predetermined coating face.

The luminescent layer material, the hole injection layer material, and the electron injection layer material will be described.

(a) Luminescent Layer

What is required of the organic luminescent material used as the material for the luminescent layer is to satisfy all the following three function requirements: (a) a charge injection function, that is, a function that, upon the application of an electric field, holes can be injected from the anode or the hole injection layer and electrons can be injected from the cathode or the electron injection layer; (b) a transport function, that is, a function that injected holes and electrodes are moved by the force of an electric field; and (c) a luminescent function, that is, a function which provides a field for recombination of electrons and holes and leads them to luminescence. In this case, however, it is not always required that all the above functions of (a) to (c) are satisfactory. For example, some of materials in which the hole injection transport property is much better than the electron injection transport property are suitable as organic luminescent materials.

Organic luminescent materials usable herein include, for example, benzothiazole, benzoimidazole, benzoxazole or other fluorescent brightening agents and styrylbenzene compounds.

Specific examples of fluorescent brightening agents include benzoxazole fluorescent brightening agents such as 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di-(2-methyl-2-butyl)-2-benzoxazolyl]stilbene, 2,5-bis(5,7-di-t-pentyl-2-benzoxazolyl)thiophene, 2,5-bis[5-a,a-dimethylbenzyl-2-benzoxazolyl]thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]benzoxazole, and 2-[2-(4-chlorophenyl) vinyl]naphtho[1,2-d]oxazole; benzothiazole fluorescent brightening agents such as 2,2'-(p-phenylenedivinylene)-bis-benzothiazole; and benzimidazole fluorescent brightening agents such as 2-[2-[4-(2-benzimidazolyl)phenyl]vinyl]benzimidazole and 2-[2-(4-carboxyphenyl)vinyl]benzimidazole.

Specific examples of styrylbenzene compounds include 1,4-bis(2-methylstyryl)benzene, 1,4-bis(3-methylstyryl) benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, and 1,4-bis (2-methylstyryl)-2-ethylbenzene.

In addition to the above fluorescent brightening agents and styrylbenzene compounds, for example, 12-phthaloperinone, 1,4-diphenyl-1,3-butadiene, 1,1,4,4-tetraphenyl-1,3-butadiene, naphthalimide derivatives, perylene derivatives, oxadiazole derivatives, aldazine derivatives, pyraziline derivatives, cyclopentadiene derivatives, pyrrolopyrrole derivatives, styrylamine derivatives, coumarin compounds, and polymeric compounds as described in International Publication WO 90/13148 and Appl. Phys. Lett. vol. 58, 18P1982 (1991), aromatic dimethylidyne compounds, and compounds represented by general formula (I) may also be used as the organic luminescent material:

(R—Q)₂—Al—O—L  (I)

wherein L represents a hydrocarbon having 6 to 24 carbon atoms and containing a phenyl part; O—L represents a phenolate ligand; Q represents a substituted 8-quinolinolate ligand; and R represents an 8-quinolinolate ring substituent selected so as to three-dimensionally inhibit bonding of more than two substituted 8-quinolinolate ligands to the aluminum atom.

Specific examples of aromatic dimethylidyne compounds include 1,4-phenylenedimethylidyne, 4,4'-phenylenedimethylidyne, 2,5-xylylenedimethylidyne, 2,6-naphthylenedimethylidyne, 1,4-biphenylenedimethylidyne, 1,4-p-terephenylenedimethylidyne, 4,4'-bis(2,2-di-t-butylphenylvinyl)biphenyl, 4,4'-bis(2,2-diphenylvinyl)biphenyl, and derivatives thereof. Specific examples of compounds represented by general formula (I) include bis(2-methyl-8-quinolinolate)(p-phenylphenolate)aluminum (III) and bis(2-methyl-8-quinolinolate)(1-naphtholate)aluminum (III).

Compounds in which the above organic luminescent material is used as a host and a blue to green intense fluorescent coloring matter, for example, a coumarin coloring matter or the same fluorescent coloring matter as the above host has been doped, are also suitable as the organic luminescent material. When the above compounds are used as the organic luminescent material, blue to green luminescence (in which the luminescent color varies depending upon the type of the dopant) can be provided with high efficiency. Specific examples of hosts as materials for the above compounds include organic luminescent materials having a distyrylarylene skeleton (particularly preferably, for example, 4,4'-bis(2,2-diphenylvinyl)biphenyl). Specific examples of dopants as materials for the above compounds include diphenylaminovinylarylene (particularly preferably, for example, N,N-diphenylaminobiphenylbenzene) and 4,4'-bis[2-[4-(N,N-di-p-tolyl)phenyl]vinyl]biphenyl).

The thickness of the luminescent layer is not particularly limited and may be properly set according to the situation. In general, however, the thickness of the luminescent layer is preferably in the range of 5 nm to 5 μm.

(b) Hole Injection Layer

Any material having a hole injection property or an electron barrier property may be used as the material for the hole injection layer which is optionally provided (hereinafter referred to as "hole injection material"). The material may be properly selected, for example, from materials which have hitherto been used as hole injection materials for electronic photoreceptors. In this case, materials having a hole mobility of not less than $10^2$ cm$^2$/V·s (field intensity $10^4$ to $10^5$ V/cm) are preferred. The hole injection material may be either an organic material or an inorganic material.

Specific examples thereof include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, polysilane, aniline copolymers, electrically conductive polymeric oligomers (particularly thiophene oligomers), porphyrin compounds, aromatic tertiary amine compounds, styrylamine compounds, aromatic dimethylidyne compounds described above as the organic luminescent material, and inorganic semiconductors such as p-type Si and p-type SiC.

Preferred hole injection materials include porphyrin compounds, aromatic tertiary amine compounds or styrylamine compounds. Particularly preferred are aromatic tertiary amine compounds.

Specific examples of porphyrin compounds include porphin, 1,10,15,20-tetraphenyl-21H,23H-porphin copper (II), 1,10,15,20-tetraphenyl-21H,23H-porphin zinc (II), 5,10,15,20-tetrakis(pentafluorophenyl)-21H,23H-porphin, silicon phthalocyanine oxide, aluminum phthalocyanine chloride, phthalocyanine (metal-free), dilithium phthalocyanine, copper tetramethyl phthalocyanine, copper phthalocyanine, chrome phthalocyanine, zinc phthalocyanine, lead phthalocyanine, titanium phthalocyanine oxide, magnesium phthalocyanine, and copper octamethyl phthalocyanine.

Specific examples of aromatic tertiary amine compounds and styrylamine compounds include those having two fused aromatic rings in the molecule thereof, for example, N,N,N',N'-tetraphenyl-4,4'-diaminophenyl, N,N'-diphenyl-N,N'-bis(3-methylphenyl)-[1,1'-biphenyl]-4,4'-diamine, 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylaminostilbene, N-phenylcarbazole, and 4,4'-bis[N-(1-naphthyl)-N-phenylamino]biphenyl, and those in which three triphenylamine units are attached in a star burst form, for example, 4,4',4''-tris[N-(3-methylphenyl)-N-phenylamino]triphenylamine.

Among the hole injection layer materials, materials known as suitable for use in the wet process after bringing the material to a solution include water-soluble PEDOT/PSS (polyethylene dioxythiophene/polystyrene sulfonate) mixed resins.

The thickness of the hole injection layer is not particularly limited and may be properly set according to the situation. In general, however, the thickness is preferably in the range of 5 nm to 5 μm.

(c) Electron Injection Layer

Any material which has the function of transmitting electrons injected from the cathode to the luminescent layer may be used as material for the electron injection layer which is optionally provided (hereinafter referred to as "electron injection material"). In general, materials having electron affinity which is larger than the electron affinity of the organic luminescent material and is smaller than the work function of the cathode (when the cathode is of a multi-component type, the work function is the smallest) are preferred. In this case, when the energy level difference is very large, disadvantageously, a large electron injection barrier exists in that part. The electron affinity of the electron injection material is preferably substantially equal to the work function of the cathode or the electron affinity of the organic luminescent material. The electron injection material may be either an organic material or an inorganic material.

Specific examples of electron injection materials include heterocyclic tetracarboxylic acid anhydrides such as nitro-substituted fluorenone derivatives, anthraquinodimethane derivatives, diphenylquinone derivatives, thiopyran dioxide derivatives, and naphthalene perylene, carbodiimide, fluorenylidenemethane derivatives, anthrone derivatives, oxadiazole derivatives, a series of electron transport compounds disclosed as materials for the luminescent layer in Japanese Patent Laid-Open No. 194393/1984, thiazole derivatives in which the oxygen atom in an oxadiazole ring has been replaced by a sulfur atom, quinoxaline derivatives having a quinoxaline ring known as an electron-withdrawing group, metal complexes of 8-quinolinol derivatives (for example, tris(8-quinolinol)aluminum, tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc, and metal complexes in which the central metal in these metal complexes has been replaced by In, Mg, Cu, Ca, Sn, Ga, or Pb), metal-free or metalphthalocyanines, or compounds in which the end of these compounds has been substituted by an alkyl, sulfone or other group, distyrylpyrazine derivatives described above as organic luminescent materials, and inorganic semiconductors such as n-type Si or n-type SiC.

The thickness of the electron injection layer is not particularly limited and may be properly set according to the situation. In general, however, the thickness is preferably in the range of 5 nm to 5 μm.

<Positive Electrode>

Large-work function (for example, not less than 4 eV) metals, alloys, electrically conductive compounds, or mixtures of these materials are preferred as the material for the positive electrode. Specific examples thereof include electrically conductive transparent materials, for example, metals such as Au, CuI, ITO, tin oxide, and zinc oxide. The positive electrode may be prepared by forming a thin film of the above material, for example, by vapor deposition or sputtering. When luminescence (EL light) from the luminescent layer is taken out from the positive electrode side, the transmittance of the EL light in the positive electrode is preferably not less than 10%. The sheet resistance of the positive electrode is preferably not more than several hundreds of Ω/□. The thickness of the positive electrode varies depending upon the material. In general, however, the thickness is selected in the range of 10 nm to 1 μm, preferably in the range of 10 to 200 nm.

In general, the electrode formed of a metal paste may be formed by a method in which an ink paste is printed. A few methods for electrode formation will be described by taking a production process of an organic EL element 1 as an example.

In the production process which will be described later, a high-performance organic EL element can be prepared by forming all of organic material layers including a luminescent layer 4 and a hole injection layer and an electron injection layer adjacent to the luminescent layer 4 by a wet process such as coating and further forming a negative electrode layer 5 by a wet process such as coating using a metal paste without relying on vapor deposition.

In the production process which will be described later, the organic material layer may be formed by a vapor phase process such as vapor deposition. Even in this case, the effect of preventing electrode disconnection can be attained by the negative electrode formed using the metal paste.

Figure 2:
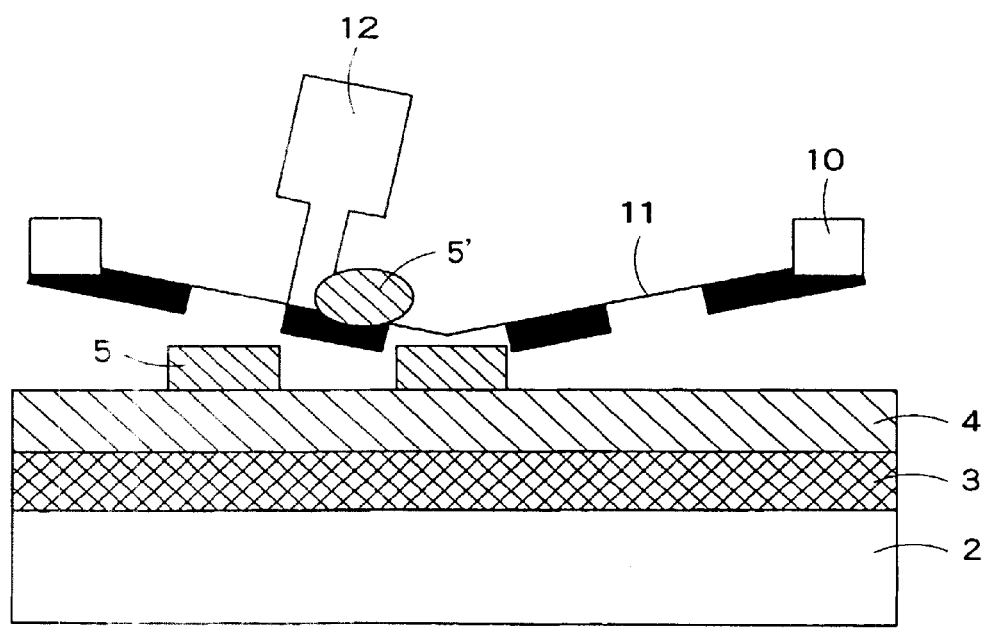
FIG. 2 is an explanatory view showing a production of the organic EL element by a screen printing method according to the present invention.

FIG. 2 is a diagram illustrating a first production process of the organic EL element 1, that is, a production process in which the metal paste is coated by the so-called screen printing. A metal paste 5' is press-spread by a squeeze 12 to pass the paste through fine holes in a screen plate 11 applied to a screen flame 10 in a tensioned state and is coated in any desired shape of an aggregate of fine holes on the substrate. The screen plate may be formed of stainless steel or an acrylic resin, and the size of holes is regulated according to the viscosity of the metal paste.

Figure 3:
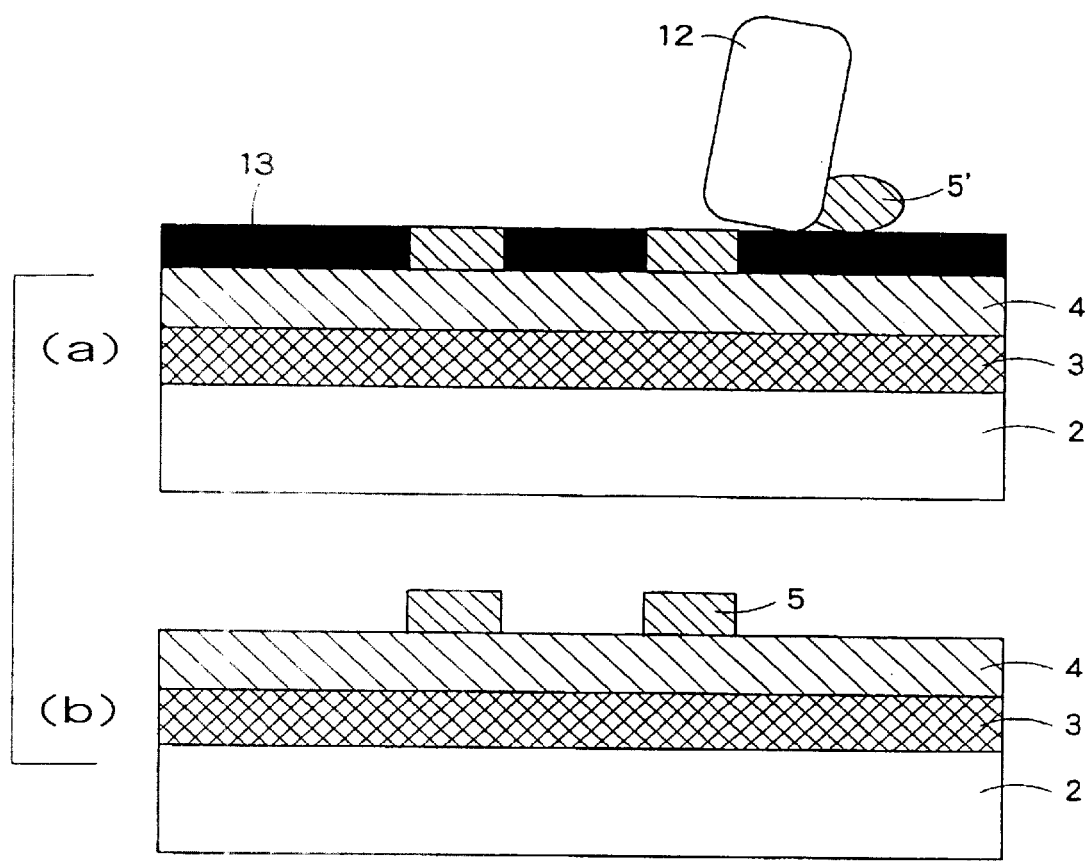
FIGS. 3(a) and 3(b) are explanatory views showing a production of the organic EL element by a metal mask printing method according to the present invention.
Figure 4:
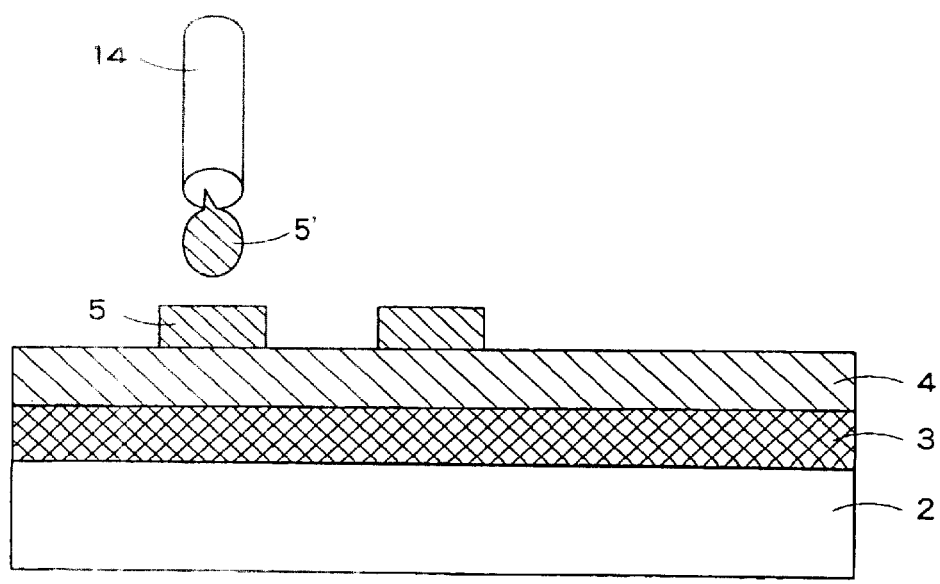
FIG. 4 is an explanatory view showing a production of the organic EL element by a dispenser coating method according to the present invention.

When the electrode shape is simpler, a second production process shown in FIG. 3 in which a metal mask 13 prepared by die-cutting a metal plate or the like into a desired shape is also useful. The die-cut mask is generally formed of a metal from the viewpoints of easy processing and robustness. However, the material for the die-cut mask is not limited to this only. An organic EL element 1 may also be formed by a dispenser method shown in FIG. 4 as a third production process.

The screen printing method is suitable for coating of any desired pattern ranging from a simple pattern to a thin line pattern having a width of not more than 100 μm with good accuracy. The metal mask printing method is suitable for coating of a simple pattern at low cost. The dispenser coating method does not require the preparation of any screen or mask and is also advantageous in that what is required for a change in pattern is only to modify the program, but on the other hand, this method is unsuitable for mass production for required production time reasons. Suitable paste viscosity varies depending upon the production process, and, thus, the viscosity is preferably modified by the composition of the metal paste according to the situation. If necessary, coating of the metal paste optionally with heating is also useful. In this case, preferably, a screen plate or a dispenser nozzle is formed of stainless steel to provide good thermal conduction.

The organic EL elements formed in the air by the first to third production processes have excellent luminescent characteristics such as voltage and luminance, but on the other hand, evenness of luminescence is not always satisfactory. In electrodes having a certain level of area, it is considered that uneven luminescence is likely to occur within the plane, and an oxide film is formed on an electrode face in contact with the luminescent layer. In order to improve the evenness of luminescence, the electrode is preferably formed under an environment in which the air has been replaced by an inert gas such as nitrogen, argon, or a mixed gas composed of nitrogen and argon, for example, within the so-called glove box.

In the formation of a striped electrode by these production processes, advantageously, pixel electrodes for constituting the so-called display device can be formed.

The display device using an organic EL element prepared by the above production process can be mounted on various electronic equipment such as portable telephones (cellular phones), PDA (personal digital assistant) type terminals, PCs (personal computers), television receivers, video cameras, and digital cameras, for constituting a display part.

Figure 5:
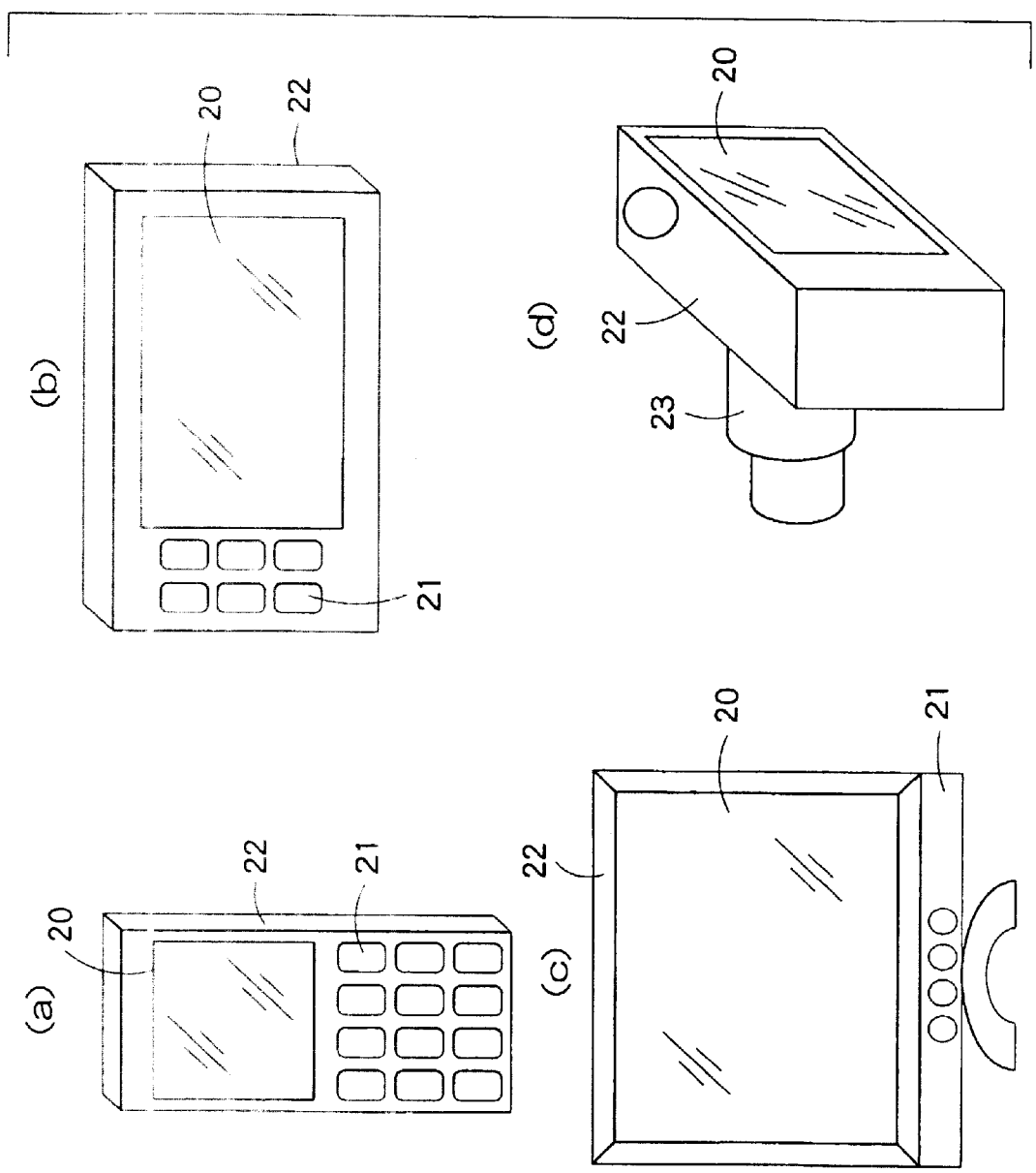
FIGS. 5(a) to 5(d) are examples showing electronic equipment on which a display device utilizing the organic EL element has been mounted.

FIG. 5 shows an example of electronic equipment having a display part provided with a display device using an organic EL element. FIG. 5 (*a*) shows a portable telephone (cellular phone), FIG. 5 (*b*) PDA, and FIG. 5 (*c*) PC. In all of these devices, a display part 20 and an operation part 21 with buttons being arranged thereon are provided on the front face. FIG. 5 (*d*) shows a digital camera in which a display part 20 is provided on the back face and a lens 23 is provided on the front face.

The present invention may be applied to various elements without being limited to the organic EL element so far as they are organic function elements having a basic construction comprising a combination of a plurality of electrodes with an organic material layer. For example, the construction according to the present invention can be applied to organic semiconductor elements to prepare organic TFT elements.

Figure 6:
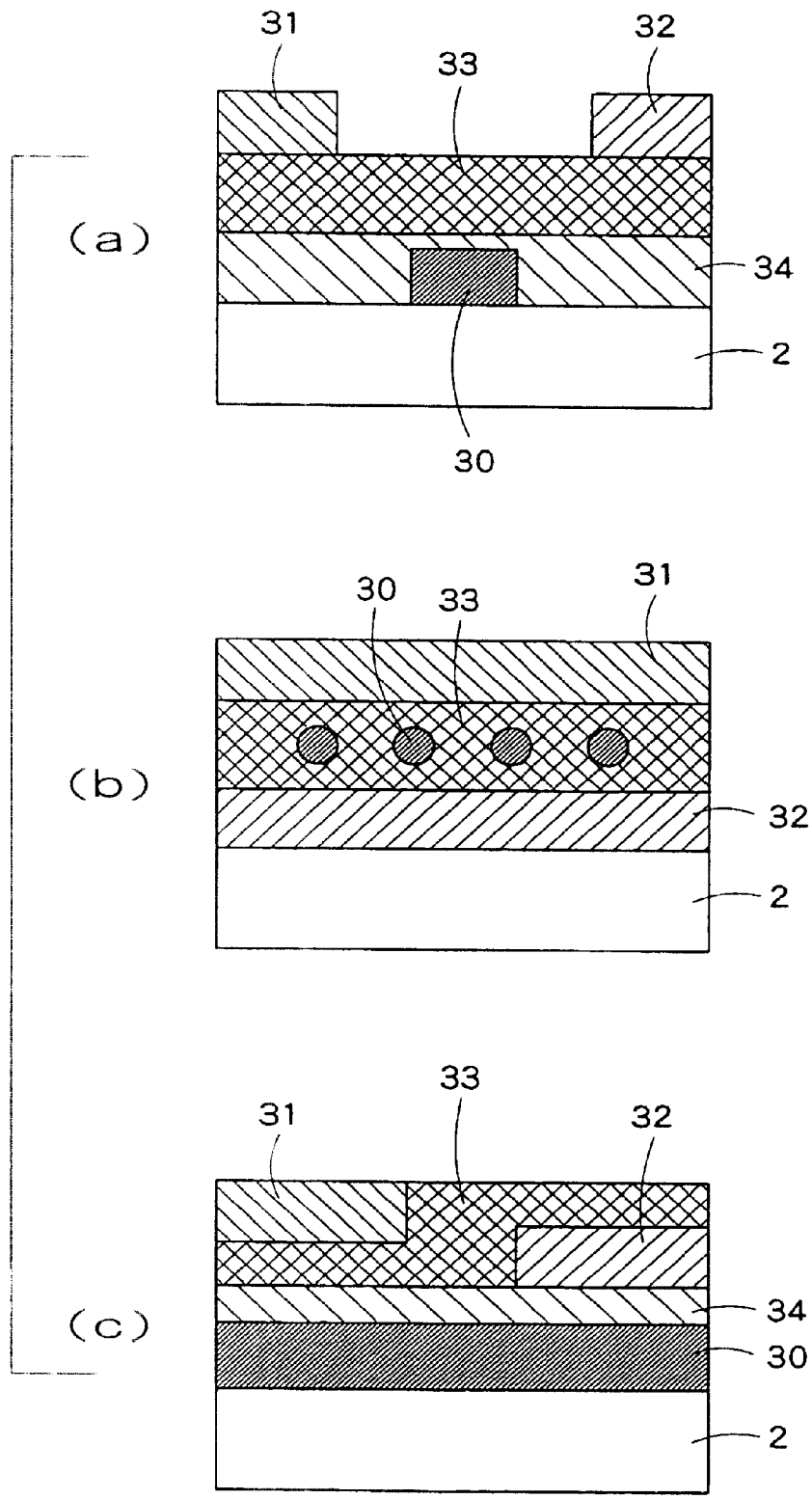
FIGS. 6(a) to (c) are typical views showing a sectional structure of an embodiment of the organic TFT element.
Figure 7:
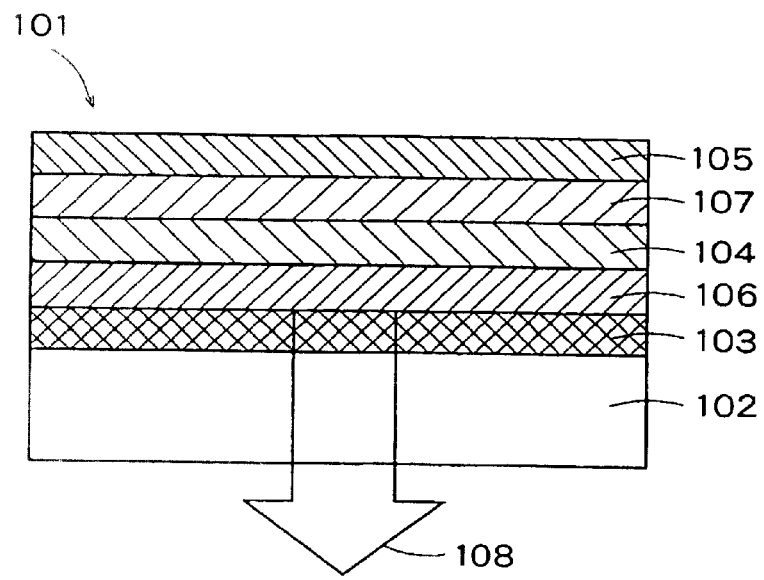
FIG. 7 is a typical view showing a sectional structure of a conventional organic EL element.

FIG. 6 is a diagram showing an example of an organic TFT element to which the present invention is applicable. FIG. 6(a) is a diagram showing an example of the construction of a planar electrode structure TFT element. In this construction, a gate electrode 30 is disposed on a base material 2 at its predetermined position. An insulating layer 34 covering the gate electrode 30 and an organic semiconductor layer 33 are stacked in that order. Further, a source electrode 31 and a drain electrode 32 are disposed on the organic semiconductor layer 33 at its respective predetermined positions.

FIG. 6 (b) is a diagram showing an example of the construction of an electrostatic induction-type (SIT) TFT element. In this construction, a drain electrode 32, an organic semiconductor layer 33, and a source electrode 31 are stacked in that order on a substrate 2. Further, a gate electrode 30 is disposed within the organic semiconductor layer 33 at its predetermined positions.

FIG. 6 (c) is a diagram showing an example of the construction of a top-and-bottom contact-type TFT element. In this construction, a gate electrode 30, an insulating layer 34, and an organic semiconductor layer 33 are stacked in that order on a substrate 2. Further, a drain electrode 32 in contact with the insulating layer and a source electrode 31 adjacent to the insulating layer through the organic semiconductor layer are disposed within the organic semiconductor layer 33 at its respective predetermined positions.

EXAMPLES

The invention described above will be illustrated in more detail with reference to the following Examples.

Example 1

(1) Preparation of Coating Liquid for Organic EL Layer Formation

Coating liquids having the following compositions for organic EL layer formation was prepared. In the compositions of the coating liquids, a fluorescent colorant was varied to prepare three coating liquids having different luminescent colors. When the fluorescent colorant is Coumarin 6, green luminescence having a peak at 501 nm is obtained; when the fluorescent colorant is perylene, blue luminescence having a peak at 460 to 470 nm; and when the fluorescent colorant is DCM (dicyanomethylene pyran derivative), red luminescence having a peak at 570 nm is obtained. These were used as luminescent materials for respective colors.

<Composition of Coating Liquid for Organic EL Layer Formation (Green, Blue or Red)>

| | |
|---|---|
| Polyvinyl carbazole | 70 parts by mass |
| Oxadiazole compound | 30 parts by mass |
| Fluorescent colorant (Coumarin 6, perylene or DCM) | 1 part by mass |
| Monochlorobenzene (solvent) | 4900 parts by mass |

(2) Preparation of Metal for Electrode Formation

An alloy of Ca (calcium) and In (indium) at a molar ratio of 1:2 was prepared in a vacuum melting furnace. In this case, the heating temperature was brought to 1000° C. so that Ca (calcium) having a melting point of 839° C. was fully melted. The alloy was crushed to prepare a crushed powder having a size of 1 to 5 mm so that the alloy could be easily weighted. The CaIn alloy thus obtained had a melting point of 835° C. and was stable at room temperature under normal conditions without decomposition.

Ga (gallium) was heated to 40° C. for melting, and CaIn (5% by mass) prepared above was immersed in the melt of Ga and, in this state, was allowed to stand for 2 hr. As a result, CaIn was swollen and softened, and, upon stirring, a viscous metal paste could be provided.

In the CaIn alloy, the Ca to In molar ratio was 1:2. Due to the molar volume of Ca, the alloy had a mass ratio of Ca:In=$1.76 \times 10^5$:1, that is, was comprised substantially of Ca. Accordingly, the mass % of CaIn corresponds to the mass % of Ca.

Multiplying the molar volume by the specific gravity gives mass per mole.

For Ca, molar volume $26.20 \times 10^3$ (m$^3$/mol) and specific gravity 1.55 (g/cm$^3$)

For In, molar volume $15.76 \times 10^{-3}$ (m$^3$/mol) and specific gravity 7.31 (g/cm$^3$)

The viscosity of this metal paste as measured with a rotational viscosimeter and was found to be 5 Pa·s.

(3) Preparation of Organic EL Element

An organic EL element having a laminated structure shown in FIG. 1 was prepared by the above first process. A 200 nm-thick ITO transparent electrode (a positive electrode 3) was formed on one side of a square-shaped glass substrate (a first base material 2) (50 mm in length×50 mm in width×0.7 mm in thickness). The substrate was cleaned, and PEDOT/PSS (Bayer CH 8000, manufactured by Bayer) was then spin coated to a thickness (film thickness after firing) of 80 nm, and the assembly was fired at 160° C. to form a PEDOT layer (a hole injection layer 6).

The following procedure was carried out in a glove box in which the air was replaced by nitrogen.

Next, the coating liquid for red organic EL layer formation was spin coated onto the PEDOT layer to a thickness (film thickness after firing) of 80 nm, and the assembly was fired at 130° C. to form a red luminescent layer (a luminescent layer 4).

The Ga-base alloy paste was printed in a square form (10 mm in length×10 mm in width×100 μm in thickness) using a stainless steel screen plate having a size of 100 meshes per inch and an opening ratio of 52%. Subsequently, the metal paste was fixed by covering with a two-component epoxy adhesive 9, and a sealing body 101 shown in FIG. 8 was installed for sealing. Thus, an organic EL element 1 was completed.

The organic EL element 1 thus prepared was DC-driven using ITO as an anode and the paste metal electrode as a cathode. As a result, luminescence started at 2.0 to 2.2 V. At 4.2 to 4.4 V, the luminescence intensity was 100 cd/m$^2$ in terms of luminance, and at 5.8 to 6.0 V, the luminescence intensity was 1000 cd/m$^2$ in terms of luminance. The time necessary for the luminance to be reduced by 50% when the initial luminance was 1000 cd/m$^2$, that is, half-life period, was measured and was found to be 100 hr.

Comparative Example 1

Figure 8:
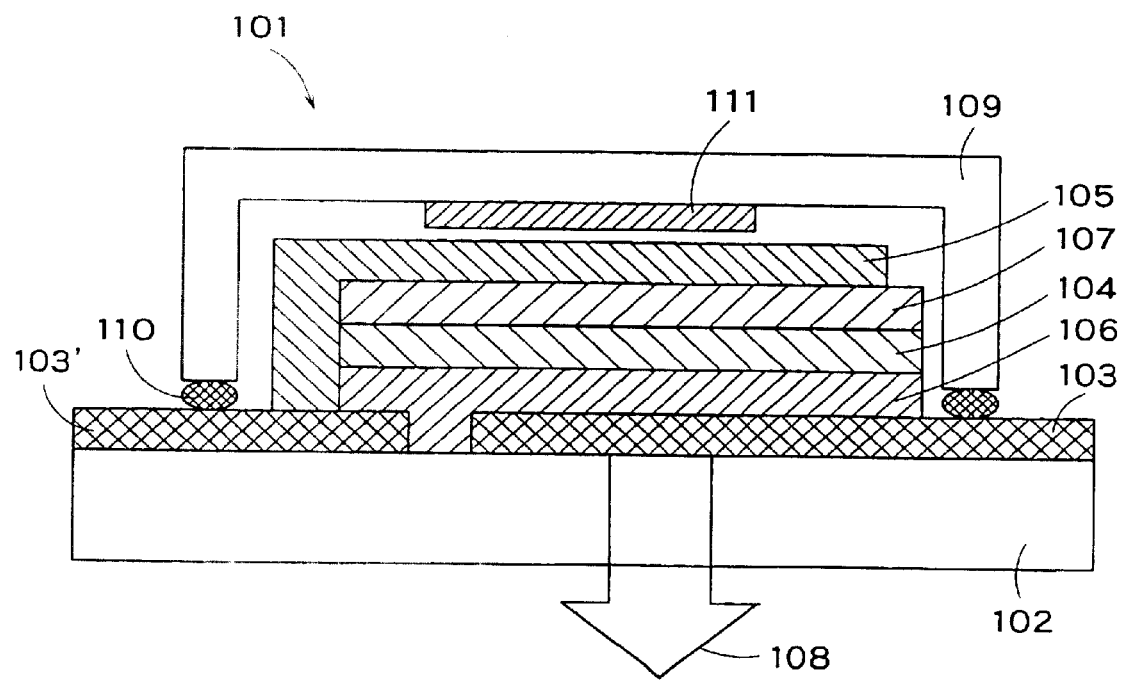
FIG. 8 is a typical view showing a sectional structure of a conventional organic EL element.

A conventional element shown in FIG. 8 having the same layer construction as in Example 1 was prepared in the same manner as in Example 1, except that 8 nm-thick Ca and 200 nm-thick Al were continuously vacuum deposited as a negative electrode on the luminescent layer. In this case, the adhesive 9 was not used. For the organic EL element in this Comparative Example, luminescence started at 2.1 V. At 4.3 V, the luminescence intensity was 100 cd/m$^2$ in terms of luminance, and at 5.9 V, the luminescence intensity was 1000 cd/m$^2$ in terms of luminance. The half-life period when the initial luminance was 1000 cd/m$^2$ was measured and was found to be 100 hr.

From the above results, it was found that, for the element prepared in Example 1, the luminescent properties and stability were substantially the same as those of the element prepared in Comparative Example 1, demonstrating that the EL display element prepared in Example 1 had properties comparable with the luminescent element prepared using vapor deposition.

Example 2

An element was prepared in the same manner as in Example 1, except that the concentration of Ca in the Ga-base alloy used in Example 1 was changed to 30% by mass. The viscosity of the Ga-base alloy was measured with a rotational viscometer and was found to be 100 Pa·s. However, the viscosity of the Ga-base alloy used in this Example was higher than that of the Ga-base alloy used in Example 1 and, in the screen printing, the Ga-base alloy paste disadvantageously clogged the mesh holes, making it impossible to form a cathode. For this reason, the same electrode pattern as in Example 1 was printed using a stainless steel metal mask. As a result, the cathode could be formed. Subsequently, in the same manner as in Example 1, the electrode of the Ga-base alloy was covered with the adhesive for fixation and sealing to prepare an organic EL element.

The organic EL element thus prepared was DC-driven using ITO as an anode and the electrode of the Ga-base alloy as a cathode. As a result, luminescence started at 2.0 to 2.2 V. At 4.2 to 4.4 V, the luminescence intensity was 100 cd/m$^2$ in terms of luminance, and at 5.8 to 6.0 V, the luminescence intensity was 1000 cd/m$^2$ in terms of luminance. The time necessary for the luminance to be reduced by 50% when the initial luminance was 1000 cd/m$^2$, that is, half-life period, was measured and was found to be 100 hr.

The above results show that, for the element prepared in Example 2, the luminescent properties and stability were substantially the same as those of the elements prepared in Example 1 and Comparative Example 1.

Example 3

Elements were prepared in the same manner as in Examples 1 and 2, except that the Ga-base alloy used in Examples 1 and 2 was coated by a dispenser method to form a cathode. In the dispenser method, a metal paste having a wide concentration range can be coated by regulating the nozzle bore diameter, ejection air pressure, and temperature to form a cathode.

The organic EL elements thus prepared were DC-driven using ITO as an anode and the electrode of the Ga-base alloy as a cathode. As a result, for both the organic EL elements, luminescence started at 2.0 to 2.2 V. At 4.2 to 4.4 V, the luminescence intensity was 100 cd/m$^2$ in terms of luminance, and at 5.8 to 6.0 V, the luminescence intensity was 1000 cd/m$^2$ in terms of luminance. The time necessary for the luminance to be reduced by 50% when the initial luminance was 1000 cd/m$^2$, that is, half-life period, was measured and was found to be 100 hr.

The above results show that, for the organic EL elements prepared in Example 3, the luminescent properties and stability were substantially the same as those of the elements prepared in Examples 1 and 2. It was further found that, when the Ca concentration was higher than 30% by mass, Ca was not fully dissolved in Ga and this concentration was the saturated concentration.

Example 4

Organic EL elements were prepared in the same manner as in Examples 1 to 3, except that the Ga-base liquid metal used in preparing a Ga-base alloy used in the negative electrode was as shown in Table 3 below.

TABLE 3

| Ga-base liquid metal | Composition, wt % |
| --- | --- |
| Ga—In | 75.5:24.5 |
| Ga—In—Sn | 62.0:25.0:13.0 |
| Ga—In—Zn | 67.0:29.0:4.0 |
| Ga—Sn | 92.0:8.0 |
| Ga—Zn | 95.0:5.0 |

For all the elements, luminescence started at 2.0 to 2.2 V. At 4.2 to 4.4 V, the luminescence intensity was 100 cd/m$^2$ in terms of luminance, and at 5.8 to 6.0 V, the luminescence intensity was 1000 cd/m$^2$ in terms of luminance. The time necessary for the luminance to be reduced by 50% when the initial luminance was 1000 cd/m$^2$, that is, half-life period, was measured and was found to be 100 hr.

The above results show that, for the organic EL elements prepared in Example 4, the luminescent properties and stability were substantially the same as those of the elements prepared in Examples 1 to 3. It was further found that all the Ga-base liquid metals constituting the Ga-base alloys had a melting point below that of Ga pure metal and can prepare Ga-base alloys more simply.

Example 5

Organic EL elements were prepared in the same manner as in Examples 1 to 4, except that the CaIn alloy added to the Ga-base alloy was changed to a CaSn alloy. The CaSn alloy was prepared in a vacuum melting furnace so that the molar ratio between Ca and Sn was 1:3. In this case, the heating temperature was brought to 1000° C. so that Ca (calcium) having a melting point of 839° C. was fully melted. The alloy was crushed to prepare a crushed powder having a size of 1 to 5 mm so that the alloy could be easily weighted. The CaSn alloy thus obtained had a melting point of 627° C. and was stable at room temperature without decomposition.

When CaSn was immersed in Ga and the Ga-base liquid metal shown in Table 3 above followed by standing, as with the use of CaIn, a Ga-base alloy could be obtained. As with CaIn, the concentration of Ca which is practical as a metal paste was 5 to 30% by mass. Further, as with CaIn, the viscosity was 5 to 100 Pa·s. In the preparation of organic EL elements, cathode was formed by a production process depending upon the viscosity of the Ga-base alloy paste in the same manner as in Examples 1 to 4, except that the metal paste (Ga-base alloy) prepared above was used. The elements thus obtained had luminescent properties substantially equal to those of the organic EL elements prepared in Examples 1 to 4. From the above results, it was found that the use of Sn instead of In can reduce the production cost of electrode materials.

Comparative Example 2

A conventional organic EL element shown in FIG. 8 was prepared in the same manner as in Comparative Example 1, except that a blue luminescent layer was formed using the coating liquid for blue organic EL layer formation. For the organic EL element in this Comparative Example, luminescence started at 2.2 V. At 4.2 V, the luminescence intensity was 100 cd/m$^2$ in terms of luminance, and at 5.5 V, the luminescence intensity was 1000 cd/m$^2$ in terms of luminance. The half-life period when the initial luminance was 1000 cd/m$^2$ was measured and was found to be 10 hr.

Comparative Example 3

A conventional organic EL element shown in FIG. 8 was prepared in the same manner as in Comparative Example 2, except that a negative electrode was formed by continuously vacuum depositing LiAl instead of CaAl. For the element in this Comparative Example, luminescence started at 2.2 V. At 3.6 V, the luminescence intensity was 100 cd/m$^2$ in terms of luminance, and at 4.7 V, the luminescence intensity was 1000 cd/m$^2$ in terms of luminance. The half-life period when the initial luminance was 1000 cd/m$^2$ was measured and was found to be 30 hr. As is apparent also from the results thus obtained, it was found that, in the organic EL element having a blue luminescent layer, the use of Li provided better luminescent efficiency than the use of Ca. The reason for this has not been fully elucidated yet, but is believed to reside in that, for the blue luminescent layer, in general, the lowest occupied molecular orbital (LUMO) in the energy band structure is higher than that in the red luminescent layer and, thus, the provision of an electron injection layer having a smaller work function is necessary for satisfactory electron injection.

Example 6

Organic EL elements were prepared in the same manner as in Examples 1 to 5, except that a blue luminescent layer was formed using the coating liquid for blue organic EL layer formation and, in addition, 0.05 to 2% by mass of each of Li, Na, K, Rb, Cs, Ba, and Be was mixed in the Ga-base alloy. For all the organic EL elements thus obtained, luminescence started at 2.2 to 2.4 V. At 3.5 to 3.7 V, the luminescence intensity was 100 cd/m$^2$ in terms of luminance, and at 4.6 to 4.8 V, the luminescence intensity was 1000 cd/m$^2$ in terms of luminance. The half-life period when the initial luminance was 1000 cd/m$^2$ was measured and was found to be 25 to 30 hr. For these organic EL elements, the luminescence intensity was comparable with that of the organic EL element of Comparative Example 3 having a blue luminescent layer.

Example 7

In the same manner as in Examples 1 to 6, conventional planar electrode structure TFT element (FIG. 6 (a)), electrostatic induction-type (SIT) TFT element (FIG. 6 (b)), and top-and-bottom contact-type TFT element (FIG. 6 (c)) were prepared.

A first base material 2 was a glass substrate, a gate electrode 30 was formed of Cr, and a gate insulating layer 34 was formed of SiO$_2$. A polythiophene which is an electrically conductive polymeric material was coated as an organic semiconductor layer 33.

A source electrode 31 was formed of the materials of Examples 1 to 6, and a drain electrode 32 was formed of aluminum (Al), platinum (Pt), and gold (Au). Various combinations of electrodes were provided.

For TFT elements having any structure, current which flows across the source electrode and the drain electrode varied with the gate voltage, and the operation of the transistor was confirmed.

Example 8

Organic EL elements and TFT elements were prepared in the same manner as in Examples 1 to 7, except that the glass substrate used as the base material and sealing body in the organic EL elements and TFT elements prepared in Examples 1 to 7 was changed to a plastic substrate.

For each element, the operation was confirmed in a flexed state. As a result, any base material cracking-derived defect which results in malfunction did not occur.

Comparative Example 4

Elements having the same construction as those of Comparative Examples 1 to 3 were prepared in the same manner as in Comparative Examples 1 to 3, except that, in the base material and sealing body in the organic EL elements prepared in Comparative Examples 1 to 3, as in Example 8, the base material was changed to a plastic substrate.

The operation was confirmed in such a state that the element was flexed. As a result, an electrode disconnection-derived failure frequently occurred before defective operation derived from cracking of the base material occurred. Comparison of Example 8 and Comparative Example 4 shows that, in Example 8, the use of the metal paste as the electrode could prevent electrode disconnection.

Example 9

(1) Preparation of Coating Liquid for Organic EL Layer Formation

A coating liquid for organic EL layer formation having the following composition was prepared.

<Material for Red Luminescent Layer Formation>

| | |
|---|---|
| Polyphenylene vinylene derivative (ADS 100 RE, manufactured by ADS) | 1 pt. wt. |
| Xylene (EL grade, manufactured by Kanto Chemical Co., Inc.) | 99 pts. wt. |

<Material for Blue Luminescent Layer Formation>

| | |
|---|---|
| Polybiphenylene derivative (ADS 251 BE, manufactured by ADS) | 1 pt. wt. |
| Xylene (EL grade, manufactured by Kanto Chemical Co., Inc.) | 99 pts. wt. |

(2) Preparation of Metal for Electrode Formation

An alloy of Ca (calcium) and In (indium) at a molar ratio of 1:2 was prepared in a vacuum melting furnace. In this case, the heating temperature was brought to 1000° C. so that Ca (calcium) having a melting point of 839° C. was fully melted. The alloy was crushed to prepare a crushed powder having a size of 1 to 5 mm so that the alloy could be easily weighted. The CaIn alloy thus obtained had a melting point of 835° C. and was stable at room temperature under normal conditions without decomposition.

CaIn (20% by mass) prepared above was immersed in a liquid alloy of GaInSn (Ga:In:Sn mass ratio=62:25:13), and, in this state, was allowed to stand for 4 hr. As a result, CaIn was swollen and softened, and, upon stirring, a viscous metal paste could be provided.

Figure 9:
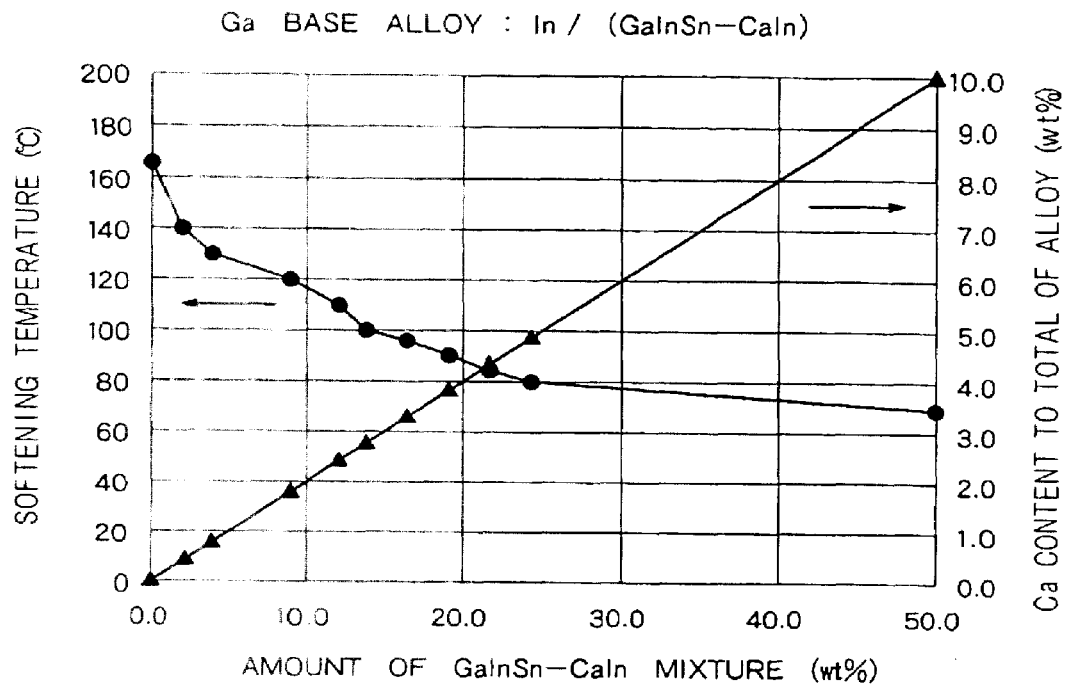
FIG. 9 is a diagram showing the relationship between the composition ratio of a Ga-base metal and the properties.

Next, In was melt mixed in the metal paste thus obtained with heating to prepare a Ga-base alloy. The softening temperature of the alloy with In added thereto decreased with increasing the content of the metal paste. The dependency of softening temperature upon In concentration is shown in FIG. 9. Regarding the Ga-base alloy prepared above, for a composition with a Ca concentration of 5% by mass, the softening temperature was 80° C., and, at 90 to 130° C., the Ga-base alloy became a paste state. On the other hand, for a composition with a Ca concentration of 10% by mass, the softening temperature was 70° C., and, at 85 to 120° C., the Ga-base alloy became a paste state.

Figure 10:
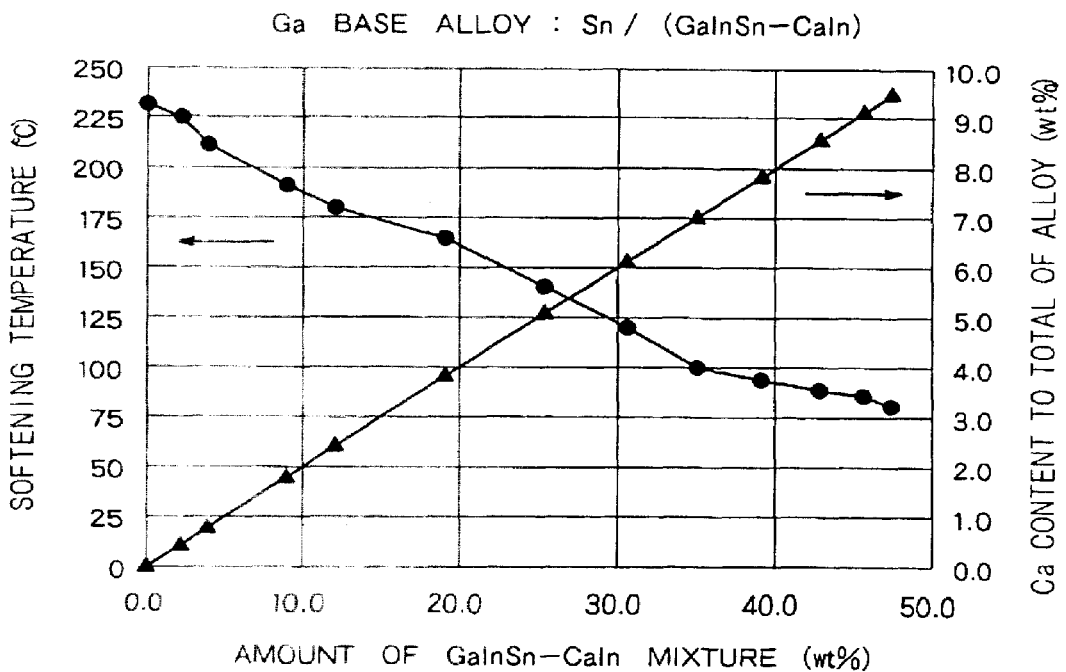
FIG. 10 is a diagram showing the relationship between the composition ratio of a Ga-base metal and the properties.

Next, a Ga-base alloy was prepared in the same manner as described above, except that Sn was used instead of In. The softening temperature of the alloy with Sn added thereto decreased with increasing the content of the metal paste. The dependency of softening temperature upon Sn concentration is shown in FIG. 10. Regarding the Ga-base alloy prepared above, for a composition with a Ca concentration of 7% by mass, the softening temperature was 110° C., and, at 120 to 150° C., the Ga-base alloy became a paste state. On the other hand, for a composition with a Ca concentration of 9.5% by mass, the softening temperature was 75° C., and, at 80 to 120° C., the Ga-base alloy became a paste state. The viscosity of the Ga-base alloy in a paste state was measured with a rotational viscometer and was found to be 5 to 100 Pa·s.

(3) Preparation of Organic EL Element

An organic EL element having a laminated structure shown in FIG. 1 was prepared by the above first process. A glass substrate with an ITO electrode in which an ITO electrode was patterned in the form of a strip with a width of 10 nm on the center of a square-shaped glass substrate (a first base material 2) (50 mm in length×50 mm in width×0.7 mm in thickness). The glass substrate with an ITO electrode was cleaned with a neutral detergent, ultrasonic cleaning, and UV ozone cleaning each for 15 min. Thereafter, PEDOT/PSS (Bayer CH 8000, manufactured by Bayer) was then spin coated onto the ITO electrode (positive electrode 3) in the glass with an ITO electrode to a thickness (film thickness after firing) of 80 nm, and the assembly was fired at 160° C. to form a PEDOT layer (a hole injection layer 6).

The following procedure was carried out in a glove box in which the air was replaced by nitrogen.

Next, the coating liquid for red organic EL layer formation was spin coated onto the PEDOT layer to a thickness (film thickness after firing) of 80 nm, and the assembly was fired at 130° C. to form a red luminescent layer (a luminescent layer 4).

While heating the Ga-base alloy with a Ca concentration of 5% by mass prepared above at 100° C., the Ga-base alloy was printed in 10 mm width, using a stainless steel screen plate having a size of 100 meshes per 100 inches and an opening ratio of 52%, so as to be orthogonal to the ITO electrode which had been patterned in a 10 mm-width strip form.

The organic EL element thus prepared was DC-driven using ITO as an anode and the metal electrode as a cathode. As a result, luminescence started at 3.0 to 3.2 V. At 5.2 to 5.4 V, the luminescence intensity was 100 cd/m$^2$ in terms of luminance, and at 7.8 to 8.0 V, the luminescence intensity was 1000 cd/m$^2$ in terms of luminance.

Comparative Example 5

A conventional element shown in FIG. 8 having the same layer construction as in Example 9 was prepared in the same manner as in Example 9, except that 8 nm-thick Ca and 200 nm-thick Al were continuously vacuum deposited as a negative electrode on the luminescent layer. For the organic EL element in this Comparative Example 5, luminescence started at 3.1 V. At 5 V, the luminescence intensity was 100 cd/m$^2$ in terms of luminance, and at 8 V, the luminescence intensity was 1000 cd/m$^2$ in terms of luminance. From the above results, it was found that, for the element prepared in Example 9, the luminescent properties were substantially the same as those of the element prepared in Comparative Example 5, demonstrating that the EL display element prepared in Example 9 had properties comparable with the luminescent element prepared using vapor deposition.

Example 10

An element was prepared in the same manner as in Example 9, except that the concentration of Ca in the Ga-base alloy used in Example 9 was changed to 10% by mass. However, the viscosity of the Ga-base alloy used in this Example 10 was higher than that of the Ga-base alloy used in Example 9, and, hence, in the screen printing, the Ga-base alloy paste disadvantageously clogged the mesh holes, making it impossible to form a cathode. For this reason, the same electrode pattern as in Example 9 was printed using a stainless steel metal mask. As a result, the cathode could be formed.

The organic EL element thus prepared was DC-driven using ITO as an anode and the metal electrode as a cathode. As a result, luminescence started at 3.0 to 3.2 V. At 5.2 to 5.4 V, the luminescence intensity was 100 cd/m$^2$ in terms of luminance, and at 7.8 to 8.0 V, the luminescence intensity was 1000 cd/m$^2$ in terms of luminance.

The above results show that, for the organic EL element prepared in Example 10, the luminescent properties were substantially the same as those of the element prepared in Example 9.

Example 11

Elements were prepared in the same manner as in Examples 9 and 10, except that the Ga-base alloy used in Examples 9 and 10 was coated by a dispenser method to form a cathode. In the dispenser method, a metal paste having a wide concentration range can be coated by regulating the nozzle bore diameter, ejection air pressure, and temperature to form a cathode.

The organic EL elements thus prepared were DC-driven using ITO as an anode and the metal electrode as a cathode. As a result, for both the organic EL elements, luminescence started at 3.0 to 3.2 V. At 5.2 to 5.4 V, the luminescence intensity was 100 cd/m$^2$ in terms of luminance, and at 7.8 to 8.0 V, the luminescence intensity was 1000 cd/m$^2$ in terms of luminance.

The above results show that, for the organic EL elements prepared in Example 11, the luminescent properties were substantially the same as those of the elements prepared in Examples 9 and 10.

Example 12

Organic EL elements were prepared in the same manner as in Examples 9 to 11, except that Sn was used instead of In contained in the Ga-base metals used in Examples 9 to 11. The luminescent properties of the element thus obtained were the same as those of the elements of Examples 9 to 11. That is, there was no difference in luminescent properties between the case where In was used and the case where Sn was used.

Example 13

Organic EL elements were prepared in the same manner as in Examples 9 to 12, except that the CaIn alloy added to the Ga-base alloy was changed to a CaSn alloy. The CaSn alloy was prepared in a vacuum melting furnace so that the molar ratio between Ca and Sn was 1:3. In this case, the heating temperature was brought to 1000° C. so that Ca (calcium) having a melting point of 839° C. was fully melted. The alloy was crushed to prepare a crushed powder having a size of 1 to 5 mm so that the alloy could be easily weighted. The CaSn alloy thus obtained had a melting point of 627° C. and was stable at room temperature under normal conditions without decomposition.

When CaSn prepared above was immersed in a liquid alloy of GaInSn (Ga:In:Sn mass ratio=62:25:13) and, in this state, was allowed to stand, as with the case of CaIn in Example 1, a viscous metal paste could be provided. As with CaIn, the concentration of Ca which is practical as a metal paste was 5 to 30% by mass. Further, as with CaIn, the viscosity was 5 to 100 Pa·s.

In the preparation of organic EL elements, cathode was formed by a production process depending upon the viscosity of the Ga-base alloy paste in the same manner as in Examples 9 to 12, except that the metal paste (Ga-base alloy) prepared above was used. All the elements thus obtained had luminescent properties substantially equal to those of the organic EL elements prepared in Examples 9 to 12. From the above results, it was found that the use of Sn instead of In can reduce the production cost of electrode materials.

Comparative Example 6

A conventional organic EL element shown in FIG. 8 was prepared in the same manner as in Comparative Example 5, except that a blue luminescent layer was formed using the coating liquid for blue organic EL layer formation. For the organic EL element in this Comparative Example, luminescence started at 3.2 V. At 5.2 V, the luminescence intensity was 100 cd/m$^2$ in terms of luminance, and at 7.5 V, the luminescence intensity was 1000 cd/m$^2$ in terms of luminance.

Comparative Example 7

A conventional organic EL element shown in FIG. 8 was prepared in the same manner as in Comparative Example 6, except that a negative electrode was formed by continuously vacuum depositing LiAl instead of CaAl. For the element in this Comparative Example, luminescence started at 3.2 V. At 4.6 V, the luminescence intensity was 100 cd/m$^2$ in terms of luminance, and at 5.7 V, the luminescence intensity was 1000 cd/m$^2$ in terms of luminance. As is apparent also from the results thus obtained, it was found that, in the organic EL element having a blue luminescent layer, the use of Li provided better luminescent efficiency than the use of Ca. The reason for this has not been fully elucidated yet, but is believed to reside in that, as described above, for the blue luminescent layer, in general, the lowest occupied molecular orbital (LUMO) in the energy band structure is higher than that in the red luminescent layer and, thus, the provision of an electron injection layer having a smaller work function is necessary for satisfactory electron injection.

Example 14

Organic EL elements were prepared in the same manner as in Examples 9 to 13, except that a blue luminescent layer was formed using the coating liquid for blue organic EL layer formation and, in addition, 0.05 to 2% by mass of each of Li, Na, K, Rb, Cs, Ba, and Be was mixed in the Ga-base alloy. For all the organic EL elements thus obtained, luminescence started at 3.2 to 3.4 V. At 4.5 to 4.7 V, the luminescence intensity was 100 cd/m$^2$ in terms of luminance, and at 5.6 to 5.8 V, the luminescence intensity was 1000 cd/m$^2$ in terms of luminance. For these organic EL elements, the luminescence intensity was comparable with that of the organic EL element of Comparative Example 7 having a blue luminescent layer.

Example 15

In the same manner as in Examples 9 to 14, conventional planar electrode structure TFT element (FIG. 6 (*a*)), electrostatic induction-type (SIT) TFT element (FIG. 6 (*b*)), and top-and-bottom contact-type TFT element (FIG. 6 (*c*)) were prepared.

A first base material 2 was a glass substrate, a gate electrode 30 was formed of Cr, and a gate insulating layer 34 was formed of SiO$_2$. A polythiophene which is an electrically conductive polymeric material was coated as an organic semiconductor layer 33.

A source electrode 31 was formed of the materials of Examples 9 to 14, and a drain electrode 32 was formed of aluminum (Al), platinum (Pt), and gold (Au). Various combinations of electrodes were provided.

For TFT elements having any structure, current which flows across the source electrode and the drain electrode varied with the gate voltage, and the operation of the transistor was confirmed.

What is claimed is:

1. A Ga-base alloy which is in a paste state at a temperature of the melting point of the Ga-base alloy or above, the Ga-base alloy having an electron injection function and comprising Ga-base liquid metal in a liquid state at room temperature, 5 to 30% by mass of Ca, and 0.05 to 2% by mass of at least one of metal selected from the group consisting of Li, Na, K, Mg, Rb, Cs, Ba, Be, and Sr.

2. The Ga-base alloy according to claim 1, which further comprises a metal having a melting point of 300° C. or below and which is in a solid state at room temperature and is brought to a paste state at a temperature of the melting point of the Ga-base alloy or above.

3. The Ga-base alloy according to claim 2, wherein the temperature range in which the Ga-base alloy is in a paste state is 5° C. or above.

4. The Ga-base alloy according to claim 2, which has a melting point of 50° C. or above.

5. The Ga-base alloy according to claim 1, wherein the Ga-base liquid metal is Ga or an alloy of Ga with at least one of metal selected from the group consisting of In, Sn, and Zn.

6. The Ga-base alloy according to claim 2, wherein the metal having a melting point of 300° C. or below is In, Sn, Bi, or an alloy composed mainly of the metals.

7. The Ga-base alloy according to claim 1, which has a viscosity in the paste state of 5 to 100 Pa·s.

8. A process for producing a Ga-base alloy according to claim 1, the process comprising;
dissolving an alloy of an alkali metal or an alkaline earth metal with In or Sn in a Ga-base liquid metal in a liquid state at room temperature to prepare a Ga-base alloy paste.

9. The process according to claim 8, wherein the alloy paste is heated to a temperature at which a metal having a melting point of 300° C. or below is melted, and the metal having a melting point of 300° C. or below is mixed in the alloy paste.

10. An organic function element comprising at least a plurality of electrodes and an organic material layer, at least one of the plurality of electrodes comprising a Ga-base alloy according to claim 1.

11. The organic function element according to claim 10, wherein the electrode comprising a Ga-base alloy is fixed and sealed with an adhesive layer.

12. A process for producing an organic function element according to claim 10, the process comprising the steps of:
heating a Ga-base alloy to bring the Ga-base alloy to a paste state; and
forming a film from the Ga-base alloy paste by screen printing, metal mask printing, or dispenser coating to form at least one electrode,
the Ga-base alloy being in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

13. The method according to claim 12, wherein the film forming step is carried out in an inert atmosphere or in vacuo.

14. The method according to claim 12, wherein the organic function element is an organic electroluminescent element, an organic semiconductor element, or an organic thin-film transistor element.

15. An organic electroluminescent element using an organic function element according to claim 10, the organic electroluminescent element comprising a cathode formed of a Ga-base alloy,
the Ga-base alloy being in a paste state at a temperature of the melting point of the Ga-base alloy or above, the Ga-base alloy comprising at least a Ga-base liquid metal in a liquid state at room temperature and an alkali metal or an alkaline earth metal and having an electron injection function.

* * * * *